US009613818B2

(12) United States Patent
Ba et al.

(10) Patent No.: US 9,613,818 B2
(45) Date of Patent: *Apr. 4, 2017

(54) DEPOSITION OF LOW FLUORINE TUNGSTEN BY SEQUENTIAL CVD PROCESS

(71) Applicant: Lam Research Corporation, Fremont, CA (US)

(72) Inventors: Xiaolan Ba, San Jose, CA (US); Raashina Humayun, Los Altos, CA (US); Michal Danek, Cupertino, CA (US); Lawrence Schloss, Palo Alto, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/723,270

(22) Filed: May 27, 2015

(65) Prior Publication Data

US 2016/0351401 A1  Dec. 1, 2016

(51) Int. Cl.
*H01L 21/285* (2006.01)
*H01L 21/768* (2006.01)
*C23C 16/52* (2006.01)
*C23C 16/458* (2006.01)
*C23C 16/455* (2006.01)

(52) U.S. Cl.
CPC ...... *H01L 21/28556* (2013.01); *C23C 16/455* (2013.01); *C23C 16/458* (2013.01); *C23C 16/52* (2013.01); *H01L 21/28568* (2013.01); *H01L 21/76877* (2013.01)

(58) Field of Classification Search
None
See application file for complete search history.

(56) References Cited

U.S. PATENT DOCUMENTS

| 4,746,375 A | 5/1988 | Iacovangelo |
| 4,804,560 A | 2/1989 | Shioya et al. |
| 4,874,719 A | 10/1989 | Kurosawa |

(Continued)

FOREIGN PATENT DOCUMENTS

| CN | 101899649 A | 12/2010 |
| CN | 103125013 A | 5/2013 |

(Continued)

OTHER PUBLICATIONS

U.S. Appl. No. 14/135,375, filed Dec. 19, 2013, entitled "Method for Depositing Extremely Low Resistivity Tungsten."

(Continued)

*Primary Examiner* — Asok K Sarkar
(74) *Attorney, Agent, or Firm* — Weaver Austin Villeneuve & Sampson LLP

(57) ABSTRACT

Provided herein are methods of depositing bulk tungsten by sequential CVD pulses, such as by alternately pulsing tungsten hexafluoride and hydrogen gas in cycles of temporally separated pulses. Some methods include depositing a tungsten nucleation layer at low pressure followed by deposition of bulk tungsten by sequential CVD to form low stress tungsten films with low fluorine content. Methods described herein may also be performed in combination with non-sequential CVD deposition and fluorine-free tungsten deposition techniques.

12 Claims, 21 Drawing Sheets

(56) References Cited

U.S. PATENT DOCUMENTS

| | | |
|---|---|---|
| 4,962,063 A | 10/1990 | Maydan et al. |
| 5,028,565 A | 7/1991 | Chang et al. |
| 5,227,329 A | 7/1993 | Kobayashi et al. |
| 5,250,329 A | 10/1993 | Miracky et al. |
| 5,250,467 A | 10/1993 | Somekh et al. |
| 5,308,655 A | 5/1994 | Eichman et al. |
| 5,326,723 A | 7/1994 | Petro et al. |
| 5,370,739 A | 12/1994 | Foster et al. |
| 5,391,394 A | 2/1995 | Hansen |
| 5,567,583 A | 10/1996 | Wang et al. |
| 5,633,200 A | 5/1997 | Hu |
| 5,661,080 A | 8/1997 | Hwang et al. |
| 5,726,096 A | 3/1998 | Jung |
| 5,795,824 A | 8/1998 | Hancock |
| 5,804,249 A | 9/1998 | Sukharev et al. |
| 5,817,576 A | 10/1998 | Tseng et al. |
| 5,833,817 A | 11/1998 | Tsai et al. |
| 5,913,145 A | 6/1999 | Lu et al. |
| 5,916,365 A | 6/1999 | Sherman |
| 5,916,634 A | 6/1999 | Fleming et al. |
| 5,926,720 A | 7/1999 | Zhao et al. |
| 5,956,609 A | 9/1999 | Lee et al. |
| 5,963,833 A | 10/1999 | Thakur |
| 5,994,749 A | 11/1999 | Oda |
| 6,001,729 A | 12/1999 | Shinriki et al. |
| 6,017,818 A | 1/2000 | Lu |
| 6,034,419 A | 3/2000 | Nicholls et al. |
| 6,037,263 A | 3/2000 | Chang |
| 6,066,366 A | 5/2000 | Berenbaum et al. |
| 6,099,904 A | 8/2000 | Mak et al. |
| 6,107,200 A | 8/2000 | Takagi et al. |
| 6,143,082 A | 11/2000 | McInerney et al. |
| 6,174,812 B1 | 1/2001 | Hsiung et al. |
| 6,206,967 B1 | 3/2001 | Mak et al. |
| 6,245,654 B1 | 6/2001 | Shih et al. |
| 6,265,312 B1 | 7/2001 | Sidhwa et al. |
| 6,277,744 B1 | 8/2001 | Yuan et al. |
| 6,284,316 B1 | 9/2001 | Sandhu et al. |
| 6,287,965 B1 | 9/2001 | Kang et al. |
| 6,294,468 B1 | 9/2001 | Gould-Choquette et al. |
| 6,297,152 B1 | 10/2001 | Itoh et al. |
| 6,306,211 B1 | 10/2001 | Takahashi et al. |
| 6,309,966 B1 | 10/2001 | Govindarajan et al. |
| 6,310,300 B1 | 10/2001 | Cooney et al. |
| 6,340,629 B1 | 1/2002 | Yeo et al. |
| 6,355,558 B1 | 3/2002 | Dixit et al. |
| 6,404,054 B1 | 6/2002 | Oh et al. |
| 6,429,126 B1 | 8/2002 | Herner et al. |
| 6,465,347 B2 | 10/2002 | Ishizuka et al. |
| 6,491,978 B1 | 12/2002 | Kalyanam |
| 6,551,929 B1 | 4/2003 | Kori et al. |
| 6,566,250 B1 | 5/2003 | Tu et al. |
| 6,566,262 B1 | 5/2003 | Rissman et al. |
| 6,581,258 B2 | 6/2003 | Yoneda et al. |
| 6,593,233 B1 | 7/2003 | Miyazaki et al. |
| 6,607,976 B2 | 8/2003 | Chen et al. |
| 6,635,965 B1 | 10/2003 | Lee et al. |
| 6,706,625 B1 | 3/2004 | Sudijono et al. |
| 6,720,261 B1 | 4/2004 | Anderson et al. |
| 6,740,585 B2 | 5/2004 | Yoon et al. |
| 6,777,331 B2 | 8/2004 | Nguyen |
| 6,797,340 B2 | 9/2004 | Fang et al. |
| 6,844,258 B1 | 1/2005 | Fair et al. |
| 6,861,356 B2 | 3/2005 | Matsuse et al. |
| 6,902,763 B1 | 6/2005 | Elers et al. |
| 6,903,016 B2 | 6/2005 | Cohen |
| 6,905,543 B1 | 6/2005 | Fair et al. |
| 6,908,848 B2 | 6/2005 | Koo |
| 6,936,538 B2 | 8/2005 | Byun |
| 6,939,804 B2 | 9/2005 | Lai et al. |
| 6,962,873 B1 | 11/2005 | Park |
| 7,005,372 B2 | 2/2006 | Levy et al. |
| 7,141,494 B2 | 11/2006 | Lee et al. |
| 7,157,798 B1 | 1/2007 | Fair et al. |
| 7,211,144 B2 | 5/2007 | Lu et al. |
| 7,220,671 B2 | 5/2007 | Simka et al. |
| 7,235,486 B2 | 6/2007 | Kori et al. |
| 7,262,125 B2 | 8/2007 | Wongsenakhum et al. |
| 7,355,254 B2 | 4/2008 | Datta et al. |
| 7,416,979 B2 | 8/2008 | Yoon et al. |
| 7,419,904 B2 | 9/2008 | Kato |
| 7,429,402 B2 | 9/2008 | Gandikota et al. |
| 7,465,665 B2 | 12/2008 | Xi et al. |
| 7,465,666 B2 | 12/2008 | Kori et al. |
| 7,501,343 B2 | 3/2009 | Byun et al. |
| 7,501,344 B2 | 3/2009 | Byun et al. |
| 7,563,718 B2 | 7/2009 | Kim |
| 7,589,017 B2 | 9/2009 | Chan et al. |
| 7,595,263 B2 | 9/2009 | Chung et al. |
| 7,605,083 B2 | 10/2009 | Lai et al. |
| 7,611,990 B2 | 11/2009 | Yoon et al. |
| 7,655,567 B1 | 2/2010 | Gao et al. |
| 7,674,715 B2 | 3/2010 | Kori et al. |
| 7,675,119 B2 | 3/2010 | Taguwa |
| 7,691,749 B2 | 4/2010 | Levy et al. |
| 7,695,563 B2 | 4/2010 | Lu et al. |
| 7,709,385 B2 | 5/2010 | Xi et al. |
| 7,732,327 B2 | 6/2010 | Lee et al. |
| 7,745,329 B2 | 6/2010 | Wang et al. |
| 7,745,333 B2 | 6/2010 | Lai et al. |
| 7,749,815 B2 | 7/2010 | Byun |
| 7,754,604 B2 | 7/2010 | Wongsenakhum et al. |
| 7,772,114 B2 | 8/2010 | Chan et al. |
| 7,955,972 B2 | 6/2011 | Chan et al. |
| 7,964,505 B2 | 6/2011 | Khandelwal et al. |
| 7,977,243 B2 | 7/2011 | Sakamoto et al. |
| 8,048,805 B2 | 11/2011 | Chan et al. |
| 8,053,365 B2 | 11/2011 | Humayun et al. |
| 8,058,170 B2 | 11/2011 | Chandrashekar et al. |
| 8,062,977 B1 | 11/2011 | Ashtiani et al. |
| 8,071,478 B2 | 12/2011 | Wu et al. |
| 8,087,966 B2 | 1/2012 | Hebbinghaus et al. |
| 8,101,521 B1 | 1/2012 | Gao et al. |
| 8,110,877 B2 | 2/2012 | Mukherjee et al. |
| 8,207,062 B2 | 6/2012 | Gao et al. |
| 8,258,057 B2 | 9/2012 | Kuhn et al. |
| 8,329,576 B2 | 12/2012 | Chan et al. |
| 8,367,546 B2 | 2/2013 | Humayun et al. |
| 8,409,985 B2 | 4/2013 | Chan et al. |
| 8,409,987 B2 | 4/2013 | Chandrashekar et al. |
| 8,551,885 B2 | 10/2013 | Chen et al. |
| 8,623,733 B2 | 1/2014 | Chen et al. |
| 8,709,948 B2 | 4/2014 | Danek et al. |
| 8,853,080 B2 | 10/2014 | Guan et al. |
| 8,975,184 B2 | 3/2015 | Chen et al. |
| 8,993,055 B2 | 3/2015 | Rahtu et al. |
| 9,034,760 B2 | 5/2015 | Chen et al. |
| 9,076,843 B2 | 7/2015 | Lee et al. |
| 9,153,486 B2 | 10/2015 | Arghavani et al. |
| 9,159,571 B2 | 10/2015 | Humayun et al. |
| 9,236,297 B2 | 1/2016 | Chen et al. |
| 9,240,347 B2 | 1/2016 | Chandrashekar et al. |
| 2001/0007797 A1 | 7/2001 | Jang et al. |
| 2001/0008808 A1 | 7/2001 | Gonzalez |
| 2001/0014533 A1 | 8/2001 | Sun |
| 2001/0015494 A1 | 8/2001 | Ahn |
| 2001/0044041 A1 | 11/2001 | Badding et al. |
| 2002/0037630 A1 | 3/2002 | Agarwal et al. |
| 2002/0090796 A1 | 7/2002 | Desai et al. |
| 2002/0090811 A1 | 7/2002 | Kim et al. |
| 2002/0117399 A1 | 8/2002 | Chen et al. |
| 2002/0132472 A1 | 9/2002 | Park |
| 2002/0155722 A1 | 10/2002 | Satta et al. |
| 2002/0168840 A1 | 11/2002 | Hong et al. |
| 2002/0177316 A1 | 11/2002 | Miller et al. |
| 2002/0190379 A1 | 12/2002 | Jian et al. |
| 2003/0013300 A1* | 1/2003 | Byun ............... C23C 16/0281 438/680 |
| 2003/0059980 A1 | 3/2003 | Chen et al. |
| 2003/0082902 A1 | 5/2003 | Fukui et al. |
| 2003/0091870 A1 | 5/2003 | Bhowmik et al. |
| 2003/0104126 A1 | 6/2003 | Fang et al. |
| 2003/0123216 A1 | 7/2003 | Yoon et al. |
| 2003/0127043 A1 | 7/2003 | Lu et al. |

(56) References Cited

U.S. PATENT DOCUMENTS

| | | |
|---|---|---|
| 2003/0129828 A1 | 7/2003 | Cohen et al. |
| 2003/0190802 A1 | 10/2003 | Wang et al. |
| 2003/0194850 A1 | 10/2003 | Lewis et al. |
| 2003/0224217 A1 | 12/2003 | Byun et al. |
| 2004/0014315 A1 | 1/2004 | Lai et al. |
| 2004/0044127 A1 | 3/2004 | Okubo et al. |
| 2004/0142557 A1 | 7/2004 | Levy et al. |
| 2004/0151845 A1 | 8/2004 | Nguyen et al. |
| 2004/0202786 A1 | 10/2004 | Wongsenakhum et al. |
| 2004/0206267 A1 | 10/2004 | Sambasivan et al. |
| 2004/0247788 A1 | 12/2004 | Fang et al. |
| 2005/0031786 A1 | 2/2005 | Lee et al. |
| 2005/0059236 A1 | 3/2005 | Nishida et al. |
| 2005/0136594 A1 | 6/2005 | Kim |
| 2005/0179141 A1 | 8/2005 | Yun et al. |
| 2005/0191803 A1 | 9/2005 | Matsuse et al. |
| 2006/0003581 A1 | 1/2006 | Johnston et al. |
| 2006/0075966 A1 | 4/2006 | Chen et al. |
| 2006/0094238 A1 | 5/2006 | Levy et al. |
| 2006/0145190 A1 | 7/2006 | Salzman et al. |
| 2006/0211244 A1 | 9/2006 | Deshpande et al. |
| 2006/0284317 A1 | 12/2006 | Ito et al. |
| 2007/0087560 A1 | 4/2007 | Kwak et al. |
| 2007/0099420 A1 | 5/2007 | Dominguez et al. |
| 2007/0190780 A1 | 8/2007 | Chung et al. |
| 2008/0045010 A1 | 2/2008 | Wongsenakhum et al. |
| 2008/0081127 A1 | 4/2008 | Thompson et al. |
| 2008/0081452 A1 | 4/2008 | Kim et al. |
| 2008/0081453 A1 | 4/2008 | Kim et al. |
| 2008/0124926 A1 | 5/2008 | Chan et al. |
| 2008/0254619 A1 | 10/2008 | Lin et al. |
| 2008/0254623 A1 | 10/2008 | Chan et al. |
| 2008/0280438 A1 | 11/2008 | Lai et al. |
| 2008/0283844 A1 | 11/2008 | Hoshi et al. |
| 2009/0045517 A1 | 2/2009 | Sugiura et al. |
| 2009/0050937 A1 | 2/2009 | Murata et al. |
| 2009/0053893 A1 | 2/2009 | Khandelwal et al. |
| 2009/0142509 A1 | 6/2009 | Yamamoto |
| 2009/0149022 A1 | 6/2009 | Chan et al. |
| 2009/0160030 A1 | 6/2009 | Tuttle |
| 2009/0163025 A1 | 6/2009 | Humayun et al. |
| 2009/0315154 A1 | 12/2009 | Kirby et al. |
| 2010/0035427 A1 | 2/2010 | Chan et al. |
| 2010/0055904 A1 | 3/2010 | Chen et al. |
| 2010/0062149 A1 | 3/2010 | Ma et al. |
| 2010/0072623 A1 | 3/2010 | Prindle et al. |
| 2010/0130002 A1 | 5/2010 | Dao et al. |
| 2010/0130003 A1 | 5/2010 | Lin et al. |
| 2010/0155846 A1 | 6/2010 | Mukherjee et al. |
| 2010/0159694 A1 | 6/2010 | Chandrashekar et al. |
| 2010/0244141 A1 | 9/2010 | Beyer et al. |
| 2010/0244260 A1 | 9/2010 | Hinomura |
| 2010/0267230 A1 | 10/2010 | Chandrashekar et al. |
| 2010/0267235 A1 | 10/2010 | Chen et al. |
| 2010/0273327 A1 | 10/2010 | Chan et al. |
| 2010/0330800 A1 | 12/2010 | Ivanov et al. |
| 2011/0059608 A1 | 3/2011 | Gao et al. |
| 2011/0151670 A1 | 6/2011 | Lee et al. |
| 2011/0156154 A1 | 6/2011 | Hoentschel et al. |
| 2011/0221044 A1 | 9/2011 | Danek et al. |
| 2011/0223763 A1 | 9/2011 | Chan et al. |
| 2011/0233778 A1 | 9/2011 | Lee et al. |
| 2011/0236594 A1 | 9/2011 | Haverkamp et al. |
| 2012/0009785 A1 | 1/2012 | Chandrashekar et al. |
| 2012/0015518 A1 | 1/2012 | Chandrashekar et al. |
| 2012/0040530 A1 | 2/2012 | Humayun et al. |
| 2012/0077342 A1 | 3/2012 | Gao et al. |
| 2012/0199887 A1 | 8/2012 | Chan et al. |
| 2012/0225192 A1 | 9/2012 | Yudovsky et al. |
| 2012/0231626 A1 | 9/2012 | Lee et al. |
| 2012/0244699 A1 | 9/2012 | Khandelwal et al. |
| 2012/0294874 A1 | 11/2012 | Macary et al. |
| 2013/0043554 A1 | 2/2013 | Piper |
| 2013/0062677 A1 | 3/2013 | Li et al. |
| 2013/0109172 A1 | 5/2013 | Collins et al. |
| 2013/0168864 A1 | 7/2013 | Lee et al. |
| 2013/0171822 A1 | 7/2013 | Chandrashekar et al. |
| 2013/0285195 A1 | 10/2013 | Piper |
| 2013/0302980 A1 | 11/2013 | Chandrashekar et al. |
| 2014/0011358 A1 | 1/2014 | Chen et al. |
| 2014/0027664 A1 | 1/2014 | Lei et al. |
| 2014/0030889 A1 | 1/2014 | Chen et al. |
| 2014/0061784 A1 | 3/2014 | Kang |
| 2014/0061931 A1 | 3/2014 | Kang |
| 2014/0073135 A1 | 3/2014 | Guan et al. |
| 2014/0154883 A1 | 6/2014 | Humayun et al. |
| 2014/0162451 A1 | 6/2014 | Chen et al. |
| 2014/0308812 A1 | 10/2014 | Arghavani et al. |
| 2014/0319614 A1* | 10/2014 | Paul ............ H01L 29/66795 257/365 |
| 2015/0037972 A1 | 2/2015 | Danek et al. |
| 2015/0056803 A1 | 2/2015 | Chandrashekar et al. |
| 2015/0179461 A1 | 6/2015 | Bamnolker et al. |
| 2015/0279732 A1 | 10/2015 | Lee et al. |
| 2016/0118345 A1 | 4/2016 | Chen et al. |
| 2016/0190008 A1 | 6/2016 | Chandrashekar et al. |
| 2016/0233220 A1 | 8/2016 | Danek et al. |

FOREIGN PATENT DOCUMENTS

| | | |
|---|---|---|
| EP | 0 437 110 | 7/1991 |
| EP | 1 156 132 | 11/2001 |
| EP | 1 179 838 | 2/2002 |
| JP | S5629648 A | 3/1981 |
| JP | 08-115984 | 5/1996 |
| JP | 09-027596 | 1/1997 |
| JP | H10-144688 | 5/1998 |
| JP | H10-163132 | 6/1998 |
| JP | 11-330006 | 11/1999 |
| JP | 2000-208516 | 7/2000 |
| JP | 2000-235962 | 8/2000 |
| JP | 2001-525889 | 12/2001 |
| JP | 2002-124488 | 4/2002 |
| JP | 2003-193233 | 7/2003 |
| JP | 2004-235456 | 8/2004 |
| JP | 2004-273764 | 9/2004 |
| JP | 2005-029821 | 2/2005 |
| JP | 2005-518088 | 6/2005 |
| JP | 2007-009298 | 1/2007 |
| JP | 2007-027627 | 2/2007 |
| JP | 2007-027680 | 2/2007 |
| JP | 2007-507892 | 3/2007 |
| JP | 2007-520052 | 7/2007 |
| JP | 2007-250907 | 9/2007 |
| JP | 2007-251164 | 9/2007 |
| JP | 2008-016803 | 1/2008 |
| JP | 2008-060603 | 3/2008 |
| JP | 2008-091844 | 4/2008 |
| JP | 2008-283220 | 11/2008 |
| JP | 2009-024252 | 2/2009 |
| JP | 2009-144242 | 7/2009 |
| JP | 2009-533877 | 9/2009 |
| JP | 2009-540123 | 11/2009 |
| KR | 10-2002-0049730 | 6/2002 |
| KR | 10-2005-0022261 | 3/2005 |
| KR | 10-2005-0087428 | 8/2005 |
| KR | 10-2006-0087844 | 8/2006 |
| KR | 100705936 | 4/2007 |
| KR | 10-2008-0036679 | 4/2008 |
| KR | 10-2008-0110897 | 12/2008 |
| KR | 10-2009-0103815 | 10/2009 |
| WO | WO 98/51838 | 11/1998 |
| WO | WO 01/27347 | 4/2001 |
| WO | WO 01/29893 | 4/2001 |
| WO | WO 02/41379 | 5/2002 |
| WO | WO 03/029515 | 4/2003 |
| WO | WO 2005/027211 | 3/2005 |
| WO | WO 2005/034223 | 4/2005 |
| WO | WO 2007/121249 | 10/2007 |
| WO | WO 2007/146537 | 12/2007 |
| WO | WO 2010/025357 | 3/2010 |
| WO | WO 2011/119293 | 9/2011 |

(56) References Cited

FOREIGN PATENT DOCUMENTS

| WO | WO 2013/148444 | 10/2013 |
| WO | WO 2013/148880 | 10/2013 |
| WO | WO 2014/058536 | 4/2014 |

OTHER PUBLICATIONS

U.S. Appl. No. 13/758,928, filed Feb. 4, 2013, entitled "Methods for Forming All Tungsten Contacts and Lines."
US Office Action, dated Apr. 7, 2014, issued in U.S. Appl. No. 13/633,502.
US Final Office Action, dated Nov. 5, 2014, issued in U.S. Appl. No. 13/633,502.
US Notice of Allowance, dated Mar. 2, 2015, issued in U.S. Appl. No. 13/633,502.
US Notice of Allowance (Supplemental Notice of Allowability), dated Apr. 16, 2015, issued in U.S. Appl. No. 13/633,502.
US Office Action, dated May 30, 2014, issued in U.S. Appl. No. 13/862,048.
US Final Office Action, dated Oct. 16, 2014, issued in U.S. Appl. No. 13/862,048.
US Notice of Allowance, dated Apr. 28, 2015, issued in U.S. Appl. No. 13/862,048.
US Office Action, dated May 6, 2015, issued in U.S. Appl. No. 14/135,375.
US Office Action, dated Dec. 11, 2014, issued in U.S. Appl. No. 14/173,733.
US Office Action, dated Jul. 17, 2002, issued in U.S. Appl. No. 09/975,074.
US Notice of Allowance, dated Mar. 12, 2003, issued in U.S. Appl. No. 09/975,074.
US Office Action, dated Feb. 8, 2005, issued in U.S. Appl. No. 10/649,351.
US Final Office Action, dated Jul. 14, 2005, issued in U.S. Appl. No. 10/649,351.
US Office Action, dated Dec. 30, 2005, issued in U.S. Appl. No. 10/649,351.
US Notice of Allowance, dated Jul. 21, 2006, issued in U.S. Appl. No. 10/649,351.
US Office Action, dated Jun. 22, 2004, issued in U.S. Appl. No. 10/435,010.
US Notice of Allowance, dated Oct. 7, 2004, issued in U.S. Appl. No. 10/435,010.
US Notice of Allowance, dated Jan. 19, 2005, issued in U.S. Appl. No. 10/435,010.
US Office Action, dated Nov. 23, 2005, issued in U.S. Appl. No. 10/984,126.
US Final Office Action, dated May 17, 2006, issued in U.S. Appl. No. 10/984,126.
US Notice of Allowance, dated Aug. 25, 2006, issued in U.S. Appl. No. 10/984,126.
US Office Action, dated Mar. 23, 2005, issued in U.S. Appl. No. 10/690,492.
US Notice of Allowance, dated Sep. 14, 2005, issued in U.S. Appl. No. 10/690,492.
US Office Action, dated Jun. 27, 2008, issued in U.S. Appl. No. 11/305,368.
US Office Action, dated Apr. 3, 2009, issued in U.S. Appl. No. 11/305,368.
US Notice of Allowance, dated Nov. 17, 2009, issued in U.S. Appl. No. 11/305,368.
US Office Action, dated Jul. 12, 2005, issued in U.S. Appl. No. 10/815,560.
US Final Office Action, dated Dec. 28, 2005, issued in U.S. Appl. No. 10/815,560.
US Office Action, dated Apr. 17, 2006, issued in U.S. Appl. No. 10/815,560.
US Office Action, dated Sep. 28, 2006, issued in U.S. Appl. No. 10/815,560.
US Notice of Allowance,, dated Apr. 24, 2007, issued in U.S. Appl. No. 10/815,560.
US Office Action, dated Aug. 21, 2008, issued in U.S. Appl. No. 11/265,531.
US Final Office Action, dated Feb. 26, 2009, issued in U.S. Appl. No. 11/265,531.
US Notice of Allowance, dated May 4, 2009, issued in U.S. Appl. No. 11/265,531.
US Office Action, dated Nov. 23, 2010, issued in U.S. Appl. No. 12/538,770.
US Notice of Allowance, dated Jun. 30, 2011, issued in U.S. Appl. No. 12/538,770.
US Office Action, dated Oct. 16, 2008, issued in U.S. Appl. No. 11/349,035.
US Final Office Action, dated Feb. 25, 2009, issued in U.S. Appl. No. 11/349,035.
US Office Action, dated Jun. 4, 2009, issued in U.S. Appl. No. 11/349,035.
US Final Office Action, dated Nov. 20, 2009, issued in U.S. Appl. No. 11/349,035.
US Notice of Allowance, dated Mar. 2, 2010, issued in U.S. Appl. No. 11/349,035.
US Office Action, dated Sep. 29, 2008, issued in U.S. Appl. No. 11/782,570.
US Final Office Action, dated Apr. 28, 2009, issued in U.S. Appl. No. 11/782,570.
US Notice of Allowance, dated Sep. 17, 2009, issued in U.S. Appl. No. 11/782,570.
US Office Action, dated Jan. 25, 2011, issued in U.S. Appl. No. 12/636,616.
US Final Office Action, dated Jun. 15, 2011, issued in U.S. Appl. No. 12/636,616.
US Notice of Allowance, dated Sep. 30, 2011, issued in U.S. Appl. No. 12/636,616.
US Office Action, dated Jun. 24, 2009, issued in U.S. Appl. No. 12/030,645.
US Final Office Action, dated Jan. 13, 2010, issued in U.S. Appl. No. 12/030,645.
US Final Office Action, dated Jul. 23, 2010, issued in U.S. Appl. No. 12/030,645.
US Notice of Allowance and Fee Due, dated Jan. 24, 2011, issued in U.S. Appl. No. 12/030,645.
US Office Action, dated Aug. 6, 2012, issued in U.S. Appl. No. 13/095,734.
Notice of Allowance dated Dec. 3, 2012, issued in U.S. Appl. No. 13/095,734.
US Office Action, dated Aug. 5, 2009, issued in U.S. Appl. No. 11/951,236.
US Final Office Action, dated Jan. 26, 2010 from U.S. Appl. No. 11/951,236.
US Notice of Allowance, dated Apr. 6, 2010, issued in U.S. Appl. No. 11/951,236.
US Office Action, dated Jun. 30, 2011, issued in U.S. Appl. No. 12/829,119.
US Final Office Action, dated Nov. 17, 2011, issued in U.S. Appl. No. 12/829,119.
US Office Action, dated Apr. 19, 2012, issued in U.S. Appl. No. 12/829,119.
US Notice of Allowance, dated Aug. 7, 2012, issued in U.S. Appl. No. 12/829,119.
US Office Action, dated Jun. 11, 2009, issued in U.S. Appl. No. 11/963,698.
US Final Office Action, dated Dec. 9, 2009, issued in U.S. Appl. No. 11/963,698.
US Office Action, dated Jun. 11, 2010, issued in U.S. Appl. No. 11/963,698.
US Final Office Action, dated Dec. 30, 2010, issued in U.S. Appl. No. 11/963,698.
US Notice of Allowance, dated Sep. 2, 2011, issued in U.S. Appl. No. 11/963,698.
US Office Action, dated Apr. 16, 2012, issued in U.S. Appl. No. 13/276,170.

(56) References Cited

OTHER PUBLICATIONS

US Notice of Allowance, dated Oct. 4, 2012, issued in U.S. Appl. No. 13/276,170.
US Notice of Allowance, dated Jul. 25, 2011, issued in U.S. Appl. No. 12/363,330.
US Office Action dated Oct. 21, 2009, issued in U.S. Appl. No. 12/202,126.
US Final Office Action, dated May 7, 2010, issued in U.S. Appl. No. 12/202,126.
US Office Action, dated Jul. 26, 2010 issued in U.S. Appl. No. 12/202,126.
US Final Office Action, dated Feb. 7, 2011, issued in U.S. Appl. No. 12/202,126.
US Office Action, dated Jan. 7, 2013, issued in U.S. Appl. No. 12/202,126.
US Notice of Allowance, dated Jun. 7, 2013, issued in U.S. Appl. No. 12/202,126.
US Office Action, dated May 3, 2010, issued in U.S. Appl. No. 12/407,541.
US Final Office Action, dated Oct. 19, 2010, issued in U.S. Appl. No. 12/407,541.
US Office Action, dated May 2, 2011, issued in U.S. Appl. No. 12/407,541.
US Notice of Allowance, dated Sep. 19, 2011, issued in U.S. Appl. No. 12/407,541.
US Office Action, dated Mar. 6, 2012, issued in U.S. Appl. No. 13/244,016.
US Notice of Allowance dated Nov. 29, 2012, issued in U.S. Appl. No. 13/244,016.
US Office Action, dated Jun. 14, 2011, issued in U.S. Appl. No. 12/556,490.
US Notice of Allowance, dated Mar. 2, 2012, issued in U.S. Appl. No. 12/556,490.
US Office Action, dated May 13, 2011, issued in U.S. Appl. No. 12/755,248.
US Office Action, dated Oct. 28, 2011, issued in U.S. Appl. No. 12/755,248.
US Final Office Action, dated Apr. 30, 2012, issued in U.S. Appl. No. 12/755,248.
US Office Action, dated Feb. 15, 2013, issued in U.S. Appl. No. 12/755,248.
US Office Action dated Dec. 18, 2012, issued in U.S. Appl. No. 12/723,532.
US Office Action dated Jul. 18, 2013, issued in U.S. Appl. No. 12/723,532.
US Notice of Allowance dated Dec. 24, 2013, issued in U.S. Appl. No. 12/723,532.
US Office Action, dated Feb. 16, 2012, issued in U.S. Appl. No. 12/755,259.
US Final Office Action, dated Sep. 12, 2012, issued in U.S. Appl. No. 12/755,259.
US Notice of Allowance, dated Jul. 10, 2013, issued in U.S. Appl. No. 12/755,259.
US Notice of Allowance dated Sep. 4, 2013 issued in U.S. Appl. No. 12/755,259.
US Office Action, dated Dec. 18, 2014, issued in U.S. Appl. No. 14/097,160.
US Office Action, dated May 10, 2012, issued in U.S. Appl. No. 13/020,748.
US Final Office Action, dated Nov. 16, 2012, issued in U.S. Appl. No. 13/020,748.
US Office Action, dated Feb. 24, 2014, issued in U.S. Appl. No. 13/020,748.
US Final Office Action, dated Jul. 2, 2014, issued in U.S. Appl. No. 13/020,748.
US Office Action, dated Jan. 15, 2015, issued in U.S. Appl. No. 13/774,350.
US Office Action, dated Dec. 23, 2014, issued in U.S. Appl. No. 13/851,885.
US Office Action, dated Dec. 18, 2014, issued in U.S. Appl. No. 14/502,817.
US Office Action, dated Sep. 18, 2014, issued in U.S. Appl. No. 13/928,216.
US Notice of Allowance, dated Jan. 22, 2015, issued in U.S. Appl. No. 13/928,216.
US Office Action, dated Jun. 20, 2013, issued in U.S. Appl. No. 13/560,688.
US Final Office Action, dated Feb. 14, 2014, issued in U.S. Appl. No. 13/560,688.
US Notice of Allowance, dated Nov. 4, 2014, issued in U.S. Appl. No. 13/560,688.
US Office Action, dated Jun. 14, 2013, issued in U.S. Appl. No. 13/633,798.
US Final Office Action, dated Nov. 26, 2013, issued in U.S. Appl. No. 13/633,798.
US Notice of Allowance, dated May 23, 2014, issued in U.S. Appl. No. 13/633,798.
PCT Search Report and Written Opinion, dated Jan. 19, 2005, issued in PCT/US2004/006940.
Korean First Notification of Provisional Rejection, dated Dec. 8, 2010, issued in Application No. 2004-0036346.
Korean Office Action, dated Jun. 13, 2011, issued in Application No. 2011-0032098.
Korean Office Action, dated Nov. 24, 2010, issued in Application No. KR 10-2004-0013210.
Korean Office Action, dated Mar. 28, 2013, issued in Application No. KR 10-2007-0012027.
Japanese Office Action dated May 7, 2013, issued in Application No. JP 2008-310322.
Japanese Office Action dated Sep. 3, 2013, issued in Application No. JP 2008-325333.
PCT International Search Report and Written Opinion, dated Apr. 12, 2010, issued in PCT/US2009/055349.
PCT International Preliminary Report on Patentability and Written Opinion, dated Mar. 10, 2011, issued in PCT/US2009/055349.
Chinese First Office Action dated Sep. 18, 2012 issued in Application No. 200980133560.1.
Chinese Second Office Action dated Aug. 7, 2013 issued in Application No. 200980133560.1.
Chinese Third Office Action dated Apr. 22, 2014 issued in Application No. 200980133560.1.
Chinese Fourth Office Action dated Jan. 5, 2015 issued in Application No. 200980133560.1.
Chinese Fifth Office Action dated May 5, 2015 issued in Application No. 200980133560.1.
Japanese Office Action dated Dec. 3, 2013 issued in Application No. 2011-525228.
Korean Office Action dated Sep. 6, 2012 issued in Application No. 2011-7004322.
Korean Office Action dated Jul. 19, 2013 issued in Application No. 2011-7004322.
Korean Office Action dated Nov. 4, 2013 issued in Application No. 10-2013-7027117.
Korean Office Action dated Jun. 17, 2014 issued in Application No. 10-2013-7027117.
Japanese Office Action dated Jun. 17, 2014 issued in Application No. JP 2010-055163.
Korean Office Action dated Mar. 21, 2013 issued in KR Application No. 10-2010-0024905.
Korean Notification of Provisional Rejection dated Jul. 17, 2012, issued in Application No. 2010-0087997.
Taiwan Office Action and Search Report dated Feb. 12, 2015 issued in TW 099130354.
Japanese Office Action dated Mar. 4, 2014 issued in JP 2010-093522.
Korean Office Action dated Mar. 4, 2013 in KR Application No. 2010-0035449.
Taiwan Office Action dated Dec. 27, 2014 issued in TW 099111860.
Japanese Office Action dated Jul. 29, 2014 issued in JP 2010-093544.
Korean Second Office Action dated Jan. 25, 2014 in KR Application No. 10-2010-0035453.

(56) References Cited

OTHER PUBLICATIONS

PCT International Search Report and Written Opinion, dated Jun. 28, 2013, issued in PCT/US2013/033174.
PCT International Preliminary Report on Patentability and Written Opinion, dated Oct. 9, 2014, issued in PCT/US2013/033174.
PCT International Search Report and Written Opinion, dated Jul. 26, 2013, issued in PCT/US2013/034167.
PCT International Preliminary Report on Patentability and Written Opinion, dated Oct. 9, 2014, issued in PCT/US2013/034167.
Becker, Jill (Apr. 7, 2003) "Diffusion barrier properties of tungsten nitride films grown by atomic layer deposition from bis(tert-butylimido)bis(dimethylamido)tungsten and ammonia," *Applied Physics Letters*, 82(14):2239-2241, [Retrieved online Dec. 13, 2013 at http://dx.doi.org/10.1063/1.1565699].
Bell et al. (Jan. 1996) "Batch Reactor Kinetic Studies of Tungsten LPCVD from Silane and Tungsten Hexafluoride", *J. Electrochem. Soc.*, 143(1):296-302.
Collins et al. (Jan. 21, 2003) "Pulsed Deposition of Ultra Thin Tungsten for Plugfill of High Aspect Ratio Contacts," Presentation made at Semicon Korea, 9 pages.
Diawara, Y. et al. (1993) "Rapid thermal annealing for reducing stress in tungsten x-ray mask absorber," http://dx.doi.org/10.1116/1.586673, *Journal of Vacuum Science & Technology B* 11:296-300 (per table of contents of journal).
Elam et al. (2001) "Nucleation and Growth During Tungsten Atomic Layer Deposition on $SiO_2$ Surfaces," *Thin Solid Films*, 13pp.
Fair, James A. (1983) Presentation by Inventor "Chemical Vapor Deposition of Refractory Metal Silicides," *GENUS Incorporated*, 27 pp.
George et al. (1996) "Surface Chemistry for atomic Layer Growth", *J. Phys. Chem*, 100(31):13121-13131.
Gonohe, Narishi (2002) "Tungsten Nitride Deposition by Thermal Chemical Vapor Deposition as Barrier Metal for Cu Interconnection," [http://www.jim.co.jp/journal/e/pdf3/43/07/1585.pdf.], *Materials Transactions*, 43(7):1585-1592.
Hoover, Cynthia (Jul. 2007) "Enabling Materials for Contact Metallization," *Praxair Electronic Materials R&D*, pp. 1-16.
Klaus et al. (2000) "Atomic layer deposition of tungsten using sequential surface chemistry with a sacrificial stripping reaction," *Thin Solid Films* 360:145-153.
Klaus et al. (2000) "Atomically Controlled Growth of Tungsten and Tungsten Nitride Using Sequential Surface Reactions," *Applied Surface Science*, pp. 162-163, 479-491.
Lai, Ken et al. (Jul. 17, 2000) "Tungsten chemical vapor deposition using tungsten hexacarbonyl: microstructure of as-deposited and annealed films," [http://dx.doi.org/10.1016/S0040-6090(00)00943-3], *Thin Solid Films*, 370:114-121.
Lai, Ken K. and Lamb, H. Henry (1995) "Precursors for Organometallic Chemical Vapor Deposition of Tungsten Carbide Films," *Chemistry Material*, 7(12):2284-2292.
Lee et al. (Jan. 21, 2003) "Pulsed Deposition of Ultra Thin Tungsten and its Application for Plugfill of High Aspect Ratio Contacts," Abstract, 1 page.
Li et al. (2002) "Deposition of $WN_xC_y$ Thin Films by ALCVD™ Method for Diffusion Barriers in Metallization," *IITC Conference Report*, 3 pp.
Manik, P, et al. (2012) "Fermi-level unpinning and low resistivity in contacts to n-type Ge with a thin ZnO interfacial layer," *App. Phys. Lett.* 101:182105-5.
Saito et al. (2001) "A Novel Copper Interconnection Technology Using Self Aligned Metal Capping Method," *IEEE*, 3pp.
Shioya, Yoshimi et al. (Dec. 1, 1985) "Analysis of stress in chemical vapor deposition tungsten silicide film," [Retrieved online Dec. 18, 2013 at http://dx.doi.org/10.1063/1.335552], *Journal of Applied Physics*, 58(11):4194-4199.

U.S. Appl. No. 15/040,561, filed Feb. 10, 2016, entitled "Tungsten for Wordline Applications."
U.S. Appl. No. 14/723,275, filed May 27, 2015, entitled "Tungsten Films Having Low Fluorine Content."
U.S. Appl. No. 14/965,806, filed Dec. 10, 2015, entitled "Tungsten Feature Fill."
US Office Action, dated Jan. 12, 2016, issued in U.S. Appl. No. 14/738,685.
US Notice of Allowance, dated Jun. 17, 2015, issued in U.S. Appl. No. 13/862,048.
US Final Office Action, dated Sep. 29, 2015, issued in U.S. Appl. No. 14/135,375.
US Office Action, dated Jan. 21, 2016, issued in U.S. Appl. No. 14/135,375.
US Notice of Allowance, dated Jun. 2, 2015, issued in U.S. Appl. No. 14/173,733.
US Office Action, dated Feb. 1, 2016, issued in U.S. Appl. No. 14/723,275.
US Final Office Action, dated Jun. 2, 2015, issued in U.S. Appl. No. 14/097,160.
US Notice of Allowance, dated Sep. 9, 2015, issued in U.S. Appl. No. 14/097,160.
US Office Action, dated Oct. 8, 2015, issued in U.S. Appl. No. 13/774,350.
US Final Office Action, dated Jul. 17, 2015, issued in U.S. Appl. No. 14/502,817.
US Notice of Allowance, dated Sep. 25, 2015, issued in U.S. Appl. No. 14/502,817.
US Office Action, dated May 29, 2015, issued in U.S. Appl. No. 13/949,092.
US Final Office Action, dated Jan. 14, 2016, issued in U.S. Appl. No. 13/949,092.
Taiwan Office Action dated Jun. 8, 2015 issued in Application No. TW 099107504.
Taiwan Office Action (Rejection Decision) dated Oct. 28, 2015 issued in Application No. TW 099130354.
Korean First Office Action dated Jul. 10, 2015 issued in Application No. KR 10-2014-0090283.
Taiwan Office Action dated Aug. 4, 2015 issued in Application No. TW 099111859.
Chinese Office Action [no translation] dated Feb. 26, 2016, issued in CN 201380022648.2.
Chinese Office Action dated Sep. 6, 2015 issued in Application No. CN 201310320848.8.
US Final Office Action, dated Jul. 25, 2016, issued in U.S. Appl. No. 14/738,685.
US Final Office Action, dated May 31, 2016, issued in U.S. Appl. No. 14/135,375.
US Office Action, dated Aug. 18, 2016, issued in U.S. Appl. No. 15/040,561.
US Office Action, dated Jul. 28, 2016, issued in U.S. Appl. No. 14/723,275.
US Office Action, dated Jul. 7, 2016, issued in U.S. Appl. No. 14/989,444.
US Office Action, dated Jun. 2, 2016, issued in U.S. Appl. No. 13/774,350.
US Notice of Allowance, dated Aug. 3, 2016, issued in U.S. Appl. No. 13/851,885.
US Office Action, dated Sep. 2, 2016, issued in U.S. Appl. No. 14/965,806.
US Office Action, dated Sep. 19, 2016, issued in U.S. Appl. No. 13/949,092.
Chinese First Office Action dated Feb. 26, 2016, issued in CN 201380022648.2.
Chinese First Office Action dated Mar. 18, 2016 issued in Application No. CN 201380022693.8.
Chinese Second Office Action dated May 16, 2016 issued in Application No. CN 201310320848.8.

\* cited by examiner

FIG. 1B   FIG. 1C

Constrictions 151

DEPOSITION OF LOW FLUORINE TUNGSTEN BY SEQUENTIAL CVD PROCESS

BACKGROUND

Deposition of tungsten-containing materials is an integral part of many semiconductor fabrication processes. These materials may be used for horizontal interconnects, vias between adjacent metal layers, contacts between metal layers and devices on the silicon substrate, and high aspect ratio features. In a conventional tungsten deposition process on a semiconductor substrate, the substrate is heated to the process temperature in a vacuum chamber, and a very thin portion of tungsten film which serves as a seed or nucleation layer is deposited. Thereafter, the remainder of the tungsten film (the bulk layer) is deposited on the nucleation layer by exposing the substrate to two reactants simultaneously. The bulk layer is generally deposited more rapidly than the nucleation layer. However, as devices shrink and more complex patterning schemes are utilized in the industry, deposition of thin tungsten films becomes a challenge.

SUMMARY

Provided herein are methods and apparatuses for depositing tungsten. One aspect involves a method of filling a feature including: (a) exposing a substrate in a chamber to alternating pulses of a reducing agent and a tungsten-containing precursor to deposit a tungsten nucleation layer on the substrate; and (b) exposing the substrate to alternating pulses of hydrogen and a tungsten-containing precursor to deposit a bulk tungsten layer over the tungsten nucleation layer, where the chamber pressure during (a) is no more than 10 Torr.

The method may further include: (c) exposing the substrate to a reducing agent and a tungsten-containing precursor simultaneously to deposit a second bulk tungsten layer. The method may also further include (d) performing (c) every 2 or more cycles of (b), where a cycle of (b) includes a pulse of hydrogen and a pulse of the tungsten-containing precursor.

In various embodiments, (b) is performed in cycles including a pulse of hydrogen and a pulse of the tungsten-containing precursor, and each cycle forms a submonolayer having a thickness of at least about 0.3 Å.

The tungsten-containing precursor in (a) may be different from the tungsten-containing precursor in (b). In some embodiments, the tungsten-containing precursor in (a) is fluorine-free.

The deposited tungsten may have a tensile stress less than about 1 GPa per 500 Å deposited.

Another aspect involves a method of depositing tungsten on a substrate including (a) depositing a tungsten layer on the substrate by (i) exposing the substrate to a reducing agent, and (ii) exposing the substrate to a fluorine-free tungsten-containing precursor; and (b) depositing a bulk tungsten layer in cycles including: (i) exposing the substrate to hydrogen ($H_2$), (ii) exposing the substrate to a tungsten-containing precursor, and (iii) repeating (i)-(ii) in one or more cycles to deposit the bulk tungsten layer.

In some embodiments, the fluorine-free tungsten-containing precursor is selected from the group consisting of metal-organic tungsten-containing precursors, tungsten chlorides, and tungsten hexacarbonyl.

In various embodiments, the fluorine-free tungsten-containing precursor is tungsten hexachloride. In various embodiments, the fluorine-free tungsten-containing precursor is tungsten pentachloride.

The tungsten layer in (a) may be deposited to a thickness between about 2 Å and about 100 Å. Each cycle in (b) may form a submonolayer having a thickness of at least about 0.3 Å.

Another aspect involves a method of filling a feature including: (a) exposing the substrate to alternating pulses of hydrogen and a tungsten-containing precursor to deposit a bulk tungsten layer over the substrate; and (b) exposing the substrate to a tungsten-containing precursor and a reducing agent simultaneously to deposit a second bulk tungsten layer over the substrate.

In various embodiments, (a) and (b) are repeated sequentially.

The tungsten-containing precursor in (b) may be a fluorine-free tungsten-containing precursor selected from the group consisting of metal-organic tungsten-containing precursors, tungsten chlorides, and tungsten hexacarbonyl.

In some embodiments, the tungsten-containing precursor in (a) is different from the tungsten-containing precursor in (b).

Another aspect involves an apparatus for processing substrates including: (a) at least one process chamber including a pedestal configured to hold a substrate; (b) at least one outlet for coupling to a vacuum; (c) one or more process gas inlets coupled to one or more process gas sources; and (d) a controller for controlling operations in the apparatus, including machine-readable instructions for: (i) introducing a reducing agent and a tungsten-containing precursor in alternating pulses to the process chamber; and (ii) introducing hydrogen and a tungsten-containing precursor in alternating pulses to the process chamber, whereby the chamber pressure during (i) is no more than 10 Torr.

Another aspect involves an apparatus for processing substrates including: (a) at least one process chamber including a pedestal configured to hold a substrate; (b) at least one outlet for coupling to a vacuum; (c) one or more process gas inlets coupled to one or more process gas sources; and (d) a controller for controlling operations in the apparatus, including machine-readable instructions for: (i) introducing hydrogen and a tungsten-containing precursor in alternating pulses to the process chamber to deposit bulk tungsten layer; and (ii) introducing a tungsten-containing precursor and a reducing agent to the process chamber simultaneously to deposit a second bulk tungsten layer. The controller may further include machine-readable instructions for repeating (i) and (ii) sequentially.

These and other aspects are described further below with reference to the drawings.

BRIEF DESCRIPTION OF THE DRAWINGS

FIGS. 1B-1H are schematic examples of various structures in which tungsten may be deposited in accordance with disclosed embodiments.

DETAILED DESCRIPTION

In the following description, numerous specific details are set forth to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

Tungsten (W) fill of features is often used in semiconductor device fabrication to form electrical contacts. There are various challenges in tungsten fill as devices scale to smaller technology nodes and more complex patterning structures are used. One challenge is reducing the fluorine concentration or content in the deposited tungsten film. As compared to larger features, a smaller feature having the same fluorine concentration in the tungsten film as a larger feature affects the performance of the device more substantially. For example, the smaller the feature, the thinner the films are deposited. As a result, fluorine in the deposited tungsten film is more likely to diffuse through the thinner films, thereby potentially causing device failure.

Figure 1A:
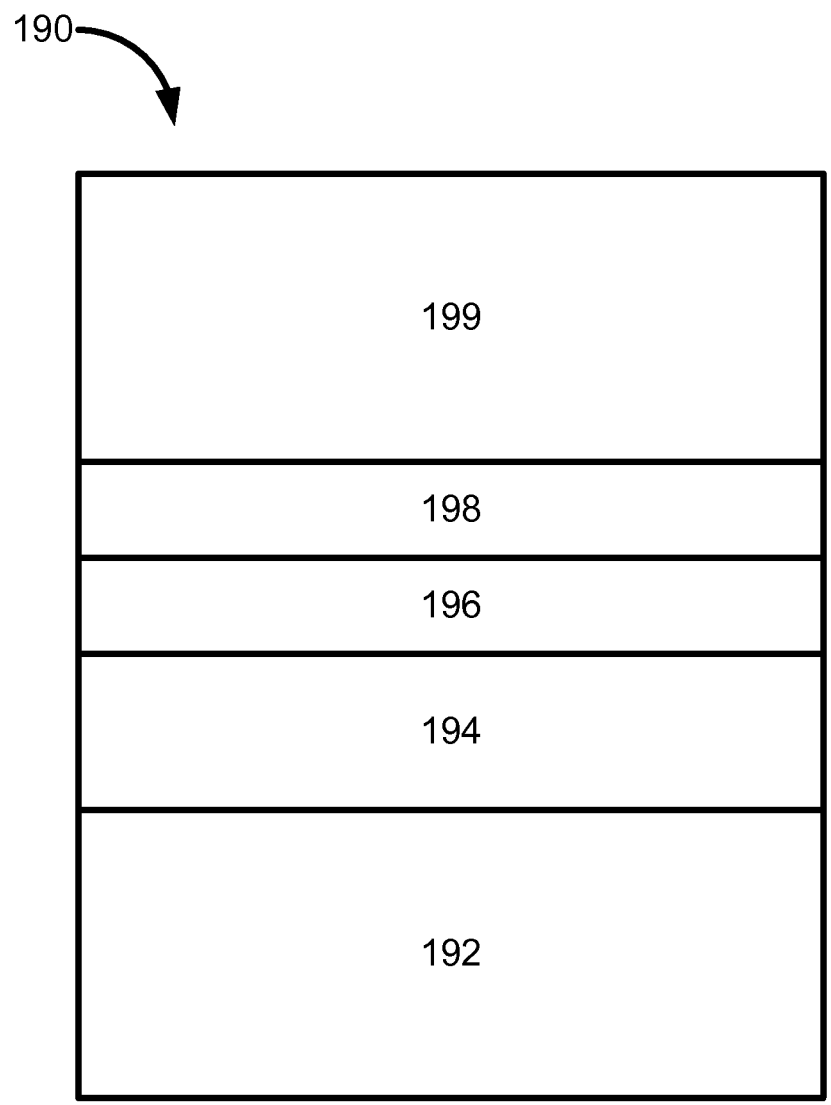
FIG. 1A is a schematic illustration of example films on a substrate.

One method of preventing fluorine diffusion includes depositing one or more barrier layers prior to depositing tungsten to prevent fluorine from diffusing from tungsten to other layers of the substrate such as an oxide layer. For example, FIG. 1A shows an example stack of layers deposited on a substrate. Substrate 190 includes a silicon layer 192, an oxide layer 194 (e.g., titanium oxide (TiOx), tetraethyl orthosilicate (TEOS) oxide, etc.), a barrier layer 196 (e.g., titanium nitride (TiN)), a tungsten nucleation layer 198, and a bulk tungsten layer 199. Barrier layer 196 is deposited to prevent fluorine diffusion from the bulk tungsten layer 199 and the tungsten nucleation layer 198 to the oxide layer. However, as devices shrink, barrier layers become thinner, and fluorine may still diffuse from the deposited tungsten layers. Although chemical vapor deposition of bulk tungsten performed at a higher temperature results in lower fluorine content, such films have poor step coverage.

Another challenge is reducing resistance in the deposited tungsten films. Thinner films tend to have higher resistance than thicker films. As features become smaller, the tungsten contact or line resistance increases due to scattering effects in the thinner tungsten films. Low resistivity tungsten films minimize power losses and overheating in integrated circuit designs. Tungsten nucleation layers typically have higher electrical resistivities than the overlying bulk layers. Barrier layers deposited in contacts, vias, and other features, may also have high resistivities. Further, thin barrier and tungsten nucleation films occupy a larger percentage of smaller features, increasing the overall resistance in the feature. Resistivity of a tungsten film depends on the thickness of the film deposited, such that resistivity increases as thickness decreases due to boundary effects.

Another challenge is reducing stress on deposited films. Thinner tungsten films tend to have increased tensile stress. Conventional techniques for depositing bulk tungsten films by chemical vapor deposition have a tensile stress greater than 2.5 GPa for a 200 Å film. High thermal tensile stress causes the substrate to curl, which makes subsequent processing difficult. For example, subsequent processes may include chemical mechanical planarization, deposition of materials, and/or clamping of the substrate to a substrate holder to perform processes in a chamber. However, these processes often rely on the substrate being flat, and a curled substrate results in nonuniform processing or inability to process the substrate. Although there are existing methods for reducing stress in films of other materials such as annealing, tungsten does not have the surface mobility to allow grains to be moved or altered once it is deposited due to its high melting point.

Provided herein are methods of depositing tungsten films having a low fluorine concentration using a sequential CVD process. The deposited films may also have low stress. Methods involve introducing hydrogen and a tungsten-containing precursor such as tungsten hexafluoride in cycles. Disclosed embodiments may be integrated with other tungsten deposition processes to deposit a low stress tungsten film having substantially lower fluorine content than films deposited by conventional CVD. For example, sequential CVD processes may be integrated with nucleation layer deposition at low pressure, fluorine-free tungsten layer deposition, and/or non-sequential CVD processes. Disclosed embodiments have a wide variety of applications. Methods may be used to deposit tungsten into features with high step coverage, and may also be used to deposit tungsten into 3D NAND and vertical NAND structures, including those with deep trenches.

Sequential CVD processes are distinguished from non-sequential CVD, pulsed CVD, atomic layer deposition (ALD), and nucleation layer deposition. Non-sequential CVD processes involve simultaneous exposure of two reactants, such that both reactants are flowed at the same time during deposition. For example, bulk tungsten may be deposited by exposing a substrate to hydrogen ($H_2$) and tungsten hexafluoride ($WF_6$) at the same time for a duration sufficient to fill features. Hydrogen and $WF_6$ react during the exposure to deposit tungsten into the features. In pulsed CVD processes, one reactant is continuously flowed while the other reactant is pulsed, but the substrate is exposed to both reactants during deposition to deposit material during each pulse. For example, a substrate may be exposed to a continuous flow of $H_2$ while $WF_6$ is pulsed, and $WF_6$ and $H_2$ react during the pulse to deposit tungsten.

In contrast, sequential CVD processes implement separate exposures to each reactant such that the reactants are not flowed into the chamber at the same time during deposition. Rather, each reactant flow is introduced to a chamber housing the substrate in temporally separated pulses in sequence, repeated one or more times in cycles. Generally a cycle is the minimum set of operations used to perform a surface deposition reaction one time. The result of one cycle is the production of at least a partial film layer on a substrate surface. Cycles of sequential CVD are described in further detail below.

ALD and nucleation layer deposition also involve exposing the substrate to two reactants in temporally separated pulses in cycles. For example, in an ALD cycle, a first reactant is flowed into a chamber, the chamber is purged, a second reactant is flowed into the chamber, and the chamber is again purged. Such cycles are typically repeated to build film thickness. In conventional ALD and nucleation layer deposition cycles, the first reactant flow constitutes a first "dose" in a self-limiting reaction. For example, a substrate includes a limited number of active sites whereby a first reactant is adsorbed onto the active sites on the substrate and saturates the surface, and a second reactant reacts with the adsorbed layer to deposit material layer by layer in cycles.

However, in sequential CVD, reactants do not necessarily adsorb onto active sites on the substrate and in some embodiments, the reaction may not be self-limiting. For example, reactants used in sequential CVD may have a low adsorption rate. Moreover, reactants on the surface of the substrate may not necessarily react with a second reactant when the second reactant is introduced. Rather, in some embodiments of sequential CVD, some reactants on the substrate remain unreacted during the cycle, and are not reacted until a subsequent cycle. Some reactants may not react due to stoichiometric properties, steric hindrance, or other effects.

Methods described herein are performed on a substrate that may be housed in a chamber. The substrate may be a silicon wafer, e.g., a 200-mm wafer, a 300-mm wafer, or a 450-mm wafer, including wafers having one or more layers of material, such as dielectric, conducting, or semi-conducting material deposited thereon. Substrates may have features such as via or contact holes, which may be characterized by one or more of narrow and/or re-entrant openings, constrictions within the feature, and high aspect ratios. A feature may be formed in one or more of the above described layers. For example, the feature may be formed at least partially in a dielectric layer. In some embodiments, a feature may have an aspect ratio of at least about 2:1, at least about 4:1, at least about 6:1, at least about 10:1, or higher. One example of a feature is a hole or via in a semiconductor substrate or a layer on the substrate.

FIGS. 1B-1H are schematic examples of various structures in which tungsten may be deposited in accordance with disclosed embodiments. FIG. 1B shows an example of a cross-sectional depiction of a vertical feature 101 to be filled with tungsten. The feature can include a feature hole 105 in a substrate 103. The hole 105 or other feature may have a dimension near the opening, e.g., an opening diameter or line width of between about 10 nm to 500 nm, for example between about 25 nm and about 300 nm. The feature hole 105 can be referred to as an unfilled feature or simply a feature. The feature 101, and any feature, may be characterized in part by an axis 118 that extends through the length of the feature, with vertically-oriented features having vertical axes and horizontally-oriented features having horizontal axes.

In some embodiments, features are trenches in a 3D NAND structure. For example, a substrate may include a wordline structure having at least 60 lines, with between 18 to 48 layers, with trenches at least 200 Å deep. Another example is a trench in a substrate or layer. Features may be of any depth. In various embodiments, the feature may have an under-layer, such as a barrier layer or adhesion layer. Non-limiting examples of under-layers include dielectric layers and conducting layers, e.g., silicon oxides, silicon nitrides, silicon carbides, metal oxides, metal nitrides, metal carbides, and metal layers.

FIG. 1C shows an example of a feature 101 that has a re-entrant profile. A re-entrant profile is a profile that narrows from a bottom, closed end, or interior of the feature to the feature opening. According to various implementations, the profile may narrow gradually and/or include an overhang at the feature opening. FIG. 1C shows an example of the latter, with an under-layer 113 lining the sidewall or interior surfaces of the feature hole 105. The under-layer 113 can be for example, a diffusion barrier layer, an adhesion layer, a nucleation layer, a combination of thereof, or any other applicable material. Non-limiting examples of under-layers can include dielectric layers and conducting layers, e.g., silicon oxides, silicon nitrides, silicon carbides, metal oxides, metal nitrides, metal carbides, and metal layers. In particular implementations an under-layer can be one or more of Ti, TiN, WN, TiAl, and W. The under-layer 113 forms an overhang 115 such that the under-layer 113 is thicker near the opening of the feature 101 than inside the feature 101.

Figure 1E:
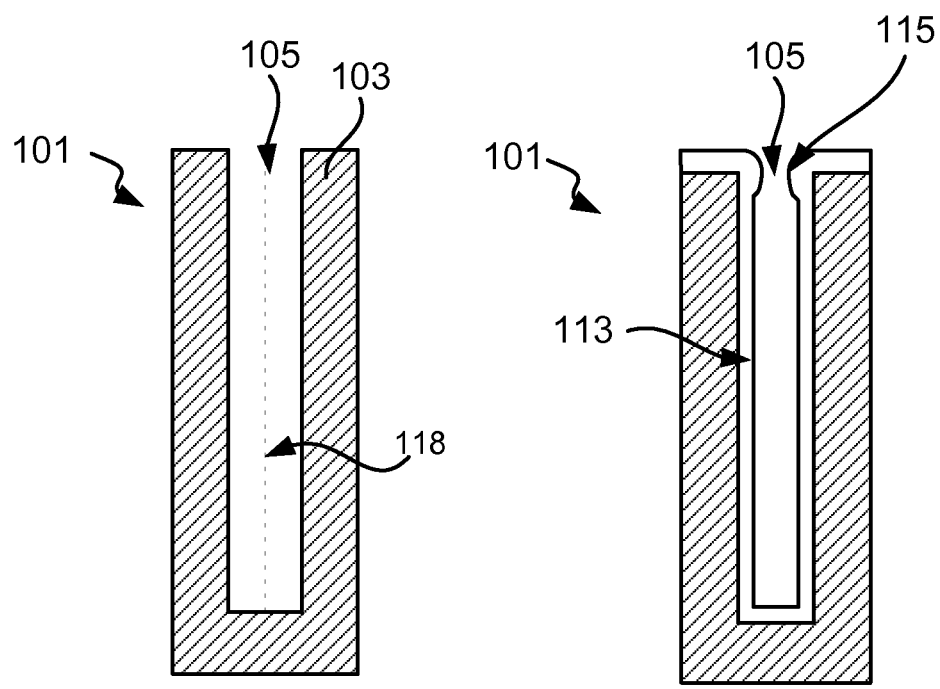
Figure 1E:
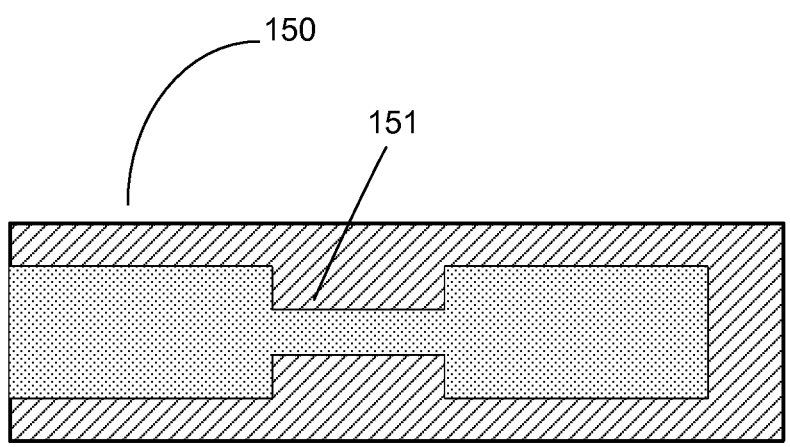
Figure 1D:
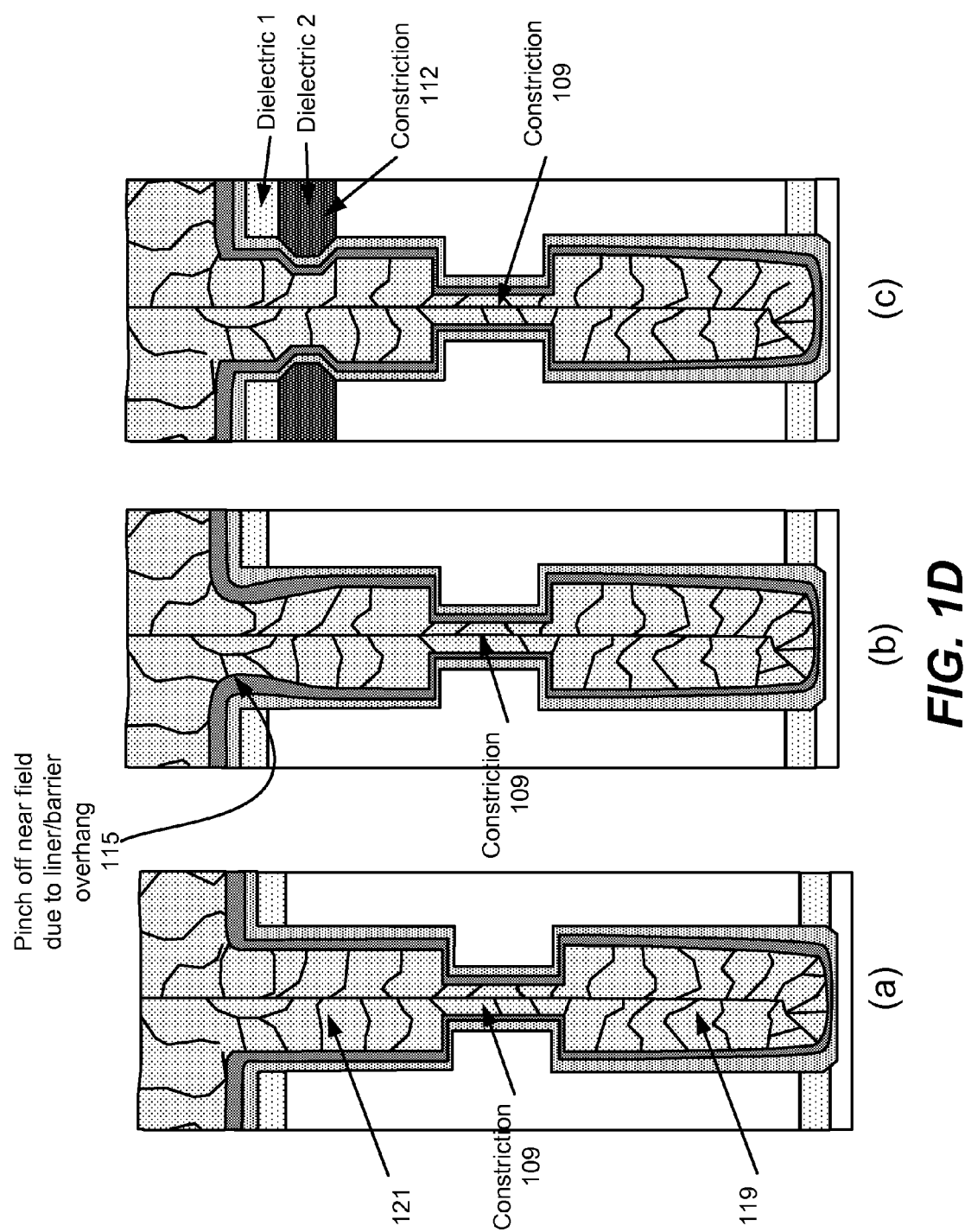

In some implementations, features having one or more constrictions within the feature may be filled. FIG. 1D shows examples of views of various filled features having constrictions. Each of the examples (a), (b) and (c) in FIG. 1D includes a constriction 109 at a midpoint within the feature. The constriction 109 can be, for example, between about 15 nm-20 nm wide. Constrictions can cause pinch off during deposition of tungsten in the feature using conventional techniques, with deposited tungsten blocking further deposition past the constriction before that portion of the feature is filled, resulting in voids in the feature. Example (b) further includes a liner/barrier overhang 115 at the feature opening. Such an overhang could also be a potential pinch-off point. Example (c) includes a constriction 112 further away from the field region than the overhang 115 in example (b).

Horizontal features, such as in 3-D memory structures, can also be filled. FIG. 1E shows an example of a horizontal feature 150 that includes a constriction 151. For example, horizontal feature 150 may be a word line in a VNAND structure.

Figure 1F:
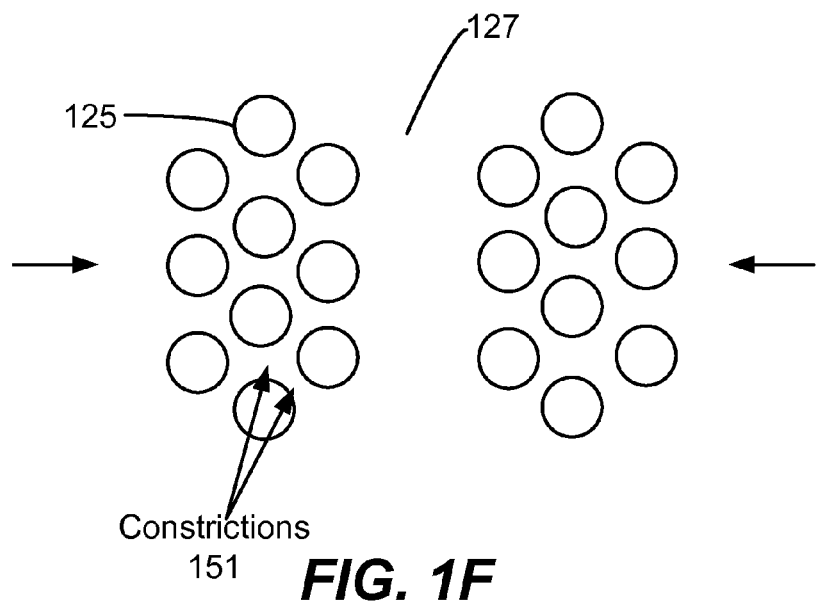
Figure 1G:
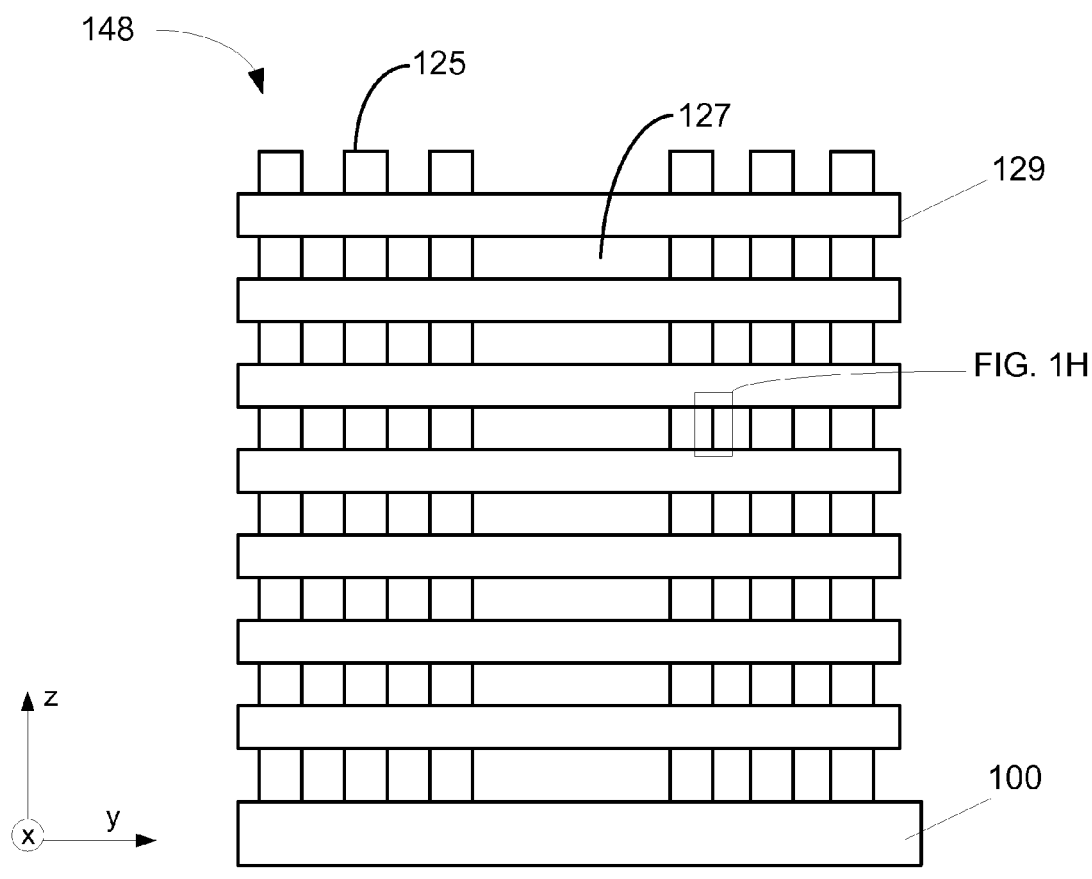

In some implementations, the constrictions can be due to the presence of pillars in a VNAND or other structure. FIG. 1F, for example, shows a plan view of pillars 125 in a VNAND or vertically integrated memory (VIM) structure 148, with FIG. 1G showing a simplified schematic of a cross-sectional depiction of the pillars 125. Arrows in FIG. 1F represent deposition material; as pillars 125 are disposed between an area 127 and a gas inlet or other deposition source, adjacent pillars can result in constrictions 151 that present challenges in void free fill of an area 127.

The structure 148 can be formed, for example, by depositing a stack of alternating interlayer dielectric layers 129 and sacrificial layers (not shown) on a substrate 100 and selectively etching the sacrificial layers. The interlayer dielectric layers may be, for example, silicon oxide and/or silicon nitride layers, with the sacrificial layers a material selectively etchable with an etchant. This may be followed by etching and deposition processes to form pillars 125, which can include channel regions of the completed memory device.

The main surface of substrate 100 can extend in the x and y directions, with pillars 125 oriented in the z-direction. In the example of FIGS. 1F and 1G, pillars 125 are arranged in an offset fashion, such that pillars 125 that are immediately adjacent in the x-direction are offset with each other in the y-direction and vice versa. According to various implementations, the pillars (and corresponding constrictions formed by adjacent pillars) may be arranged in any number of manners. Moreover, the pillars 125 may be any shape including circular, square, etc. Pillars 125 can include an annular semi-conducting material, or circular (or square) semi-conducting material. A gate dielectric may surround the semi-conducting material. The area between each interlayer dielectric layer 129 can be filled with tungsten; thus structure 148 has a plurality of stacked horizontally-oriented features that extend in the x and/or y directions to be filled.

Figure 1H:
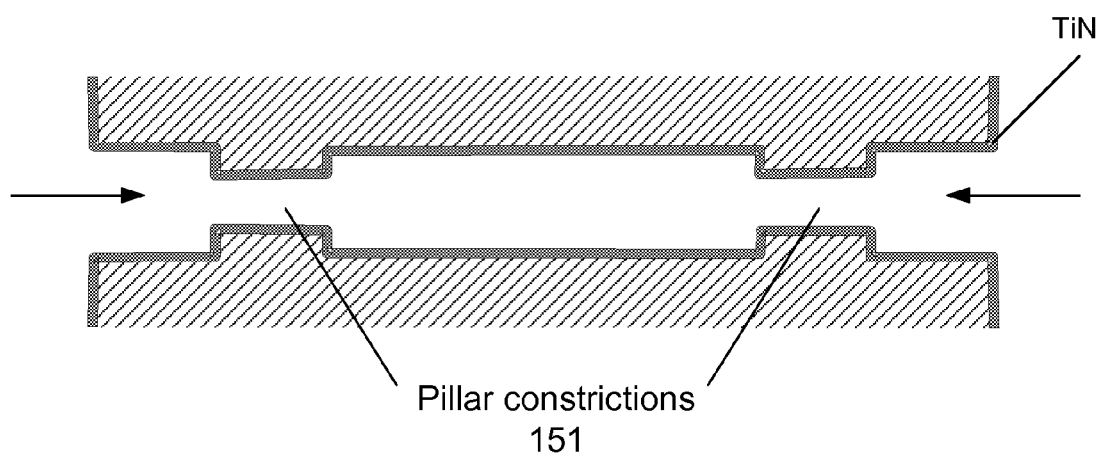

FIG. 1H provides another example of a view of horizontal feature, for example, of a VNAND or other structure including pillar constrictions 151. The example in FIG. 1H is open-ended, with material to be deposited able to enter horizontally from two sides as indicated by the arrows. (It should be noted that example in FIG. 1H can be seen as a 2-D rendering 3-D features of the structure, with the FIG. 1H being a cross-sectional depiction of an area to be filled and pillar constrictions shown in the figure representing constrictions that would be seen in a plan rather than cross-sectional view.) In some implementations, 3-D structures can be characterized with the area to be filled extending along two or three dimensions (e.g., in the x and y or x, y and z-directions in the example of FIG. 1G), and can present more challenges for fill than filling holes or trenches that extend along one or two dimensions. For example, controlling fill of a 3-D structure can be challenging as deposition gasses may enter a feature from multiple dimensions.

Examples of feature fill for horizontally-oriented and vertically-oriented features are described below. It should be noted that in most cases, the examples applicable to both horizontally-oriented or vertically-oriented features. Moreover, it should also be noted that in the description below, the term "lateral" may be used to refer to a direction generally orthogonal to the feature axis and the term "vertical" to refer to a direction generally along the feature axis.

While the description below focuses on tungsten feature fill, aspects of the disclosure may also be implemented in filling features with other materials. For example, feature fill using one or more techniques described herein may be used to fill features with other materials including other tungsten-containing materials (e.g., tungsten nitride (WN) and tungsten carbide (WC)), titanium-containing materials (e.g., titanium (Ti), titanium nitride (TiN), titanium silicide (TiSi), titanium carbide (TiC) and titanium aluminide (TiAl)), tantalum-containing materials (e.g., tantalum (Ta), and tantalum nitride (TaN)), and nickel-containing materials (e.g., nickel (Ni) and nickel silicide (NiSi). Further, the methods and apparatus disclosed herein are not limited to feature fill, but can be used to deposit tungsten on any appropriate surface including forming blanket films on planar surfaces.

Figure 2A:
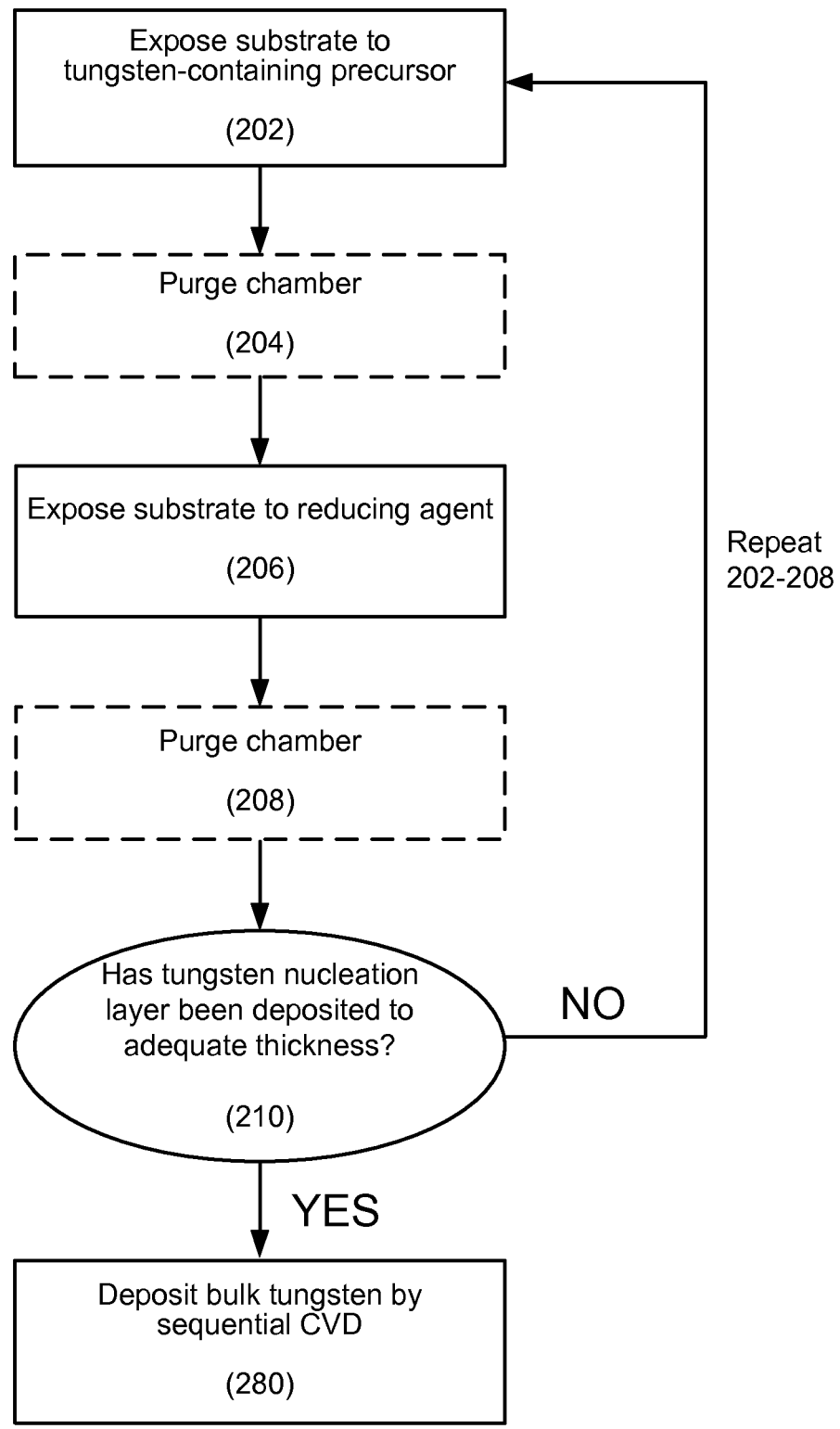
FIGS. 2A and 2B are process flow diagrams depicting operations for methods in accordance with disclosed embodiments.

FIG. 2A provides a process flow diagram for a method performed in accordance with disclosed embodiments. Operations 202-210 of FIG. 2A are performed to deposit a tungsten nucleation layer by ALD. In various embodiments described herein, operations 202-210 are performed at lower pressure than operation 280. For example, operations 202-210 may be performed at a low pressure less than about 10 Torr. In some examples, operations 202-210 are performed at a pressure of about 10 Torr, or a pressure of about 3 Torr. Without being bound by a particular theory, it is believed that performing operations 202-210 at a low pressure reduces fluorine concentration in the deposited tungsten film due to a lower partial pressure of a fluorine-containing precursor in the chamber when the film is deposited, such that less fluorine is incorporated into the film. Examples of processes for depositing a tungsten nucleation layer at low pressure to achieve low fluorine concentration in deposited tungsten are further described in U.S. patent application Ser. No. 14/723,275 filed on May 27, 2015.

In operation 202, the substrate is exposed to a tungsten-containing precursor such as $WF_6$. For purposes of the description herein, although $WF_6$ is used as an example of a tungsten-containing precursor, it should be understood that other tungsten-containing precursors may be suitable for performing disclosed embodiments. For example, a metal-organic tungsten-containing precursor may be used. Organometallic precursors and precursors that are free of fluorine, such as MDNOW (methylcyclopentadienyl-dicarbonylnitrosyl-tungsten) and EDNOW (ethylcyclopentadienyl-dicarbonylnitrosyl-tungsten) may also be used. The tungsten-containing precursor may include a combination of these compounds. In some embodiments, a carrier gas, such as nitrogen ($N_2$), argon (Ar), helium (He), or other inert gases, may be flowed during operation 202.

Operation 202 may be performed for any suitable duration and at any suitable temperature. In some examples, operation 202 may be performed for a duration between about 0.25 seconds and about 30 seconds, about 0.25 seconds to about 5 seconds, or about 0.5 seconds to about 3 seconds. This operation may be performed in some embodiments for a duration sufficient to saturate the active sites on the surface of the substrate.

In operation 204, the chamber is optionally purged to remove excess $WF_6$ that did not adsorb to the surface of the substrate. A purge may be conducted by flowing an inert gas at a fixed pressure thereby reducing the pressure of the chamber and re-pressurizing the chamber before initiating another gas exposure.

In operation 206, the substrate is exposed to a reducing agent to deposit a tungsten nucleation layer. The reducing agent may be a borane, silane, or germane. Example boranes include borane ($BH_3$), diborane ($B_2H_6$), triborane, alkyl boranes, aminoboranes, carboranes, and haloborane. Example silanes include silane ($SiH_4$), disilane ($Si_2H_6$), trisilane ($Si_3H_8$), alkyl silanes, aminosilanes, carbosilanes, and halosilane. Germanes include $Ge_nH_{n+4}$, $Ge_nH_{n+6}$, $Ge_nH_{n+8}$, and $Ge_nH_m$, where n is an integer from 1 to 10, and n is a different integer than m. Other germanes may also be used, e.g., alkyl germanes, aminogermanes, carbogermanes, and halogermanes. In general, halogermanes may not have significant reducing potential but there may be process conditions and tungsten-containing precursors suitable for film formation using halogermanes.

Operation 206 may be performed for any suitable duration. In some examples, Example durations include between about 0.25 seconds and about 30 seconds, about 0.25 seconds to about 5 seconds, or about 0.5 seconds to about 3 seconds. In some embodiments, this operation may be sufficient to react with the adsorbed layer of $WF_6$ on the surface of the substrate. Operation 206 may be performed for a duration outside of these example ranges. In some embodiments, a carrier gas may be used, such as, for example, argon (Ar), helium (He), or nitrogen ($N_2$).

After operation 206, there may be an optional purge step to purge excess reducing agent still in gas phase that did not react with $WF_6$ on the surface of the feature. A purge may be conducted by flowing an inert gas at a fixed pressure thereby reducing the pressure of the chamber and re-pressurizing the chamber before initiating another gas exposure.

In operation 210, it is determined whether the tungsten nucleation layer has been deposited to an adequate thickness. If not, operations 202-208 are repeated until a desired thickness of a tungsten nucleation layer is deposited on the surface of the feature. Each repetition of operations 202-208 may be referred to as an ALD "cycle." In some embodiments, the order of operations 202 and 206 may be reversed, such that reducing agent is introduced first.

After the tungsten nucleation layer is deposited to an adequate thickness, in operation 280, bulk tungsten is deposited by sequential CVD. In various embodiments, operation 280 may be performed at a pressure greater than the pressure during operations 202-210. For example, operation 280 may be performed at a pressure greater than or equal to about 10 Torr, for example about 10 Torr, or about 40 Torr.

Figure 2B:
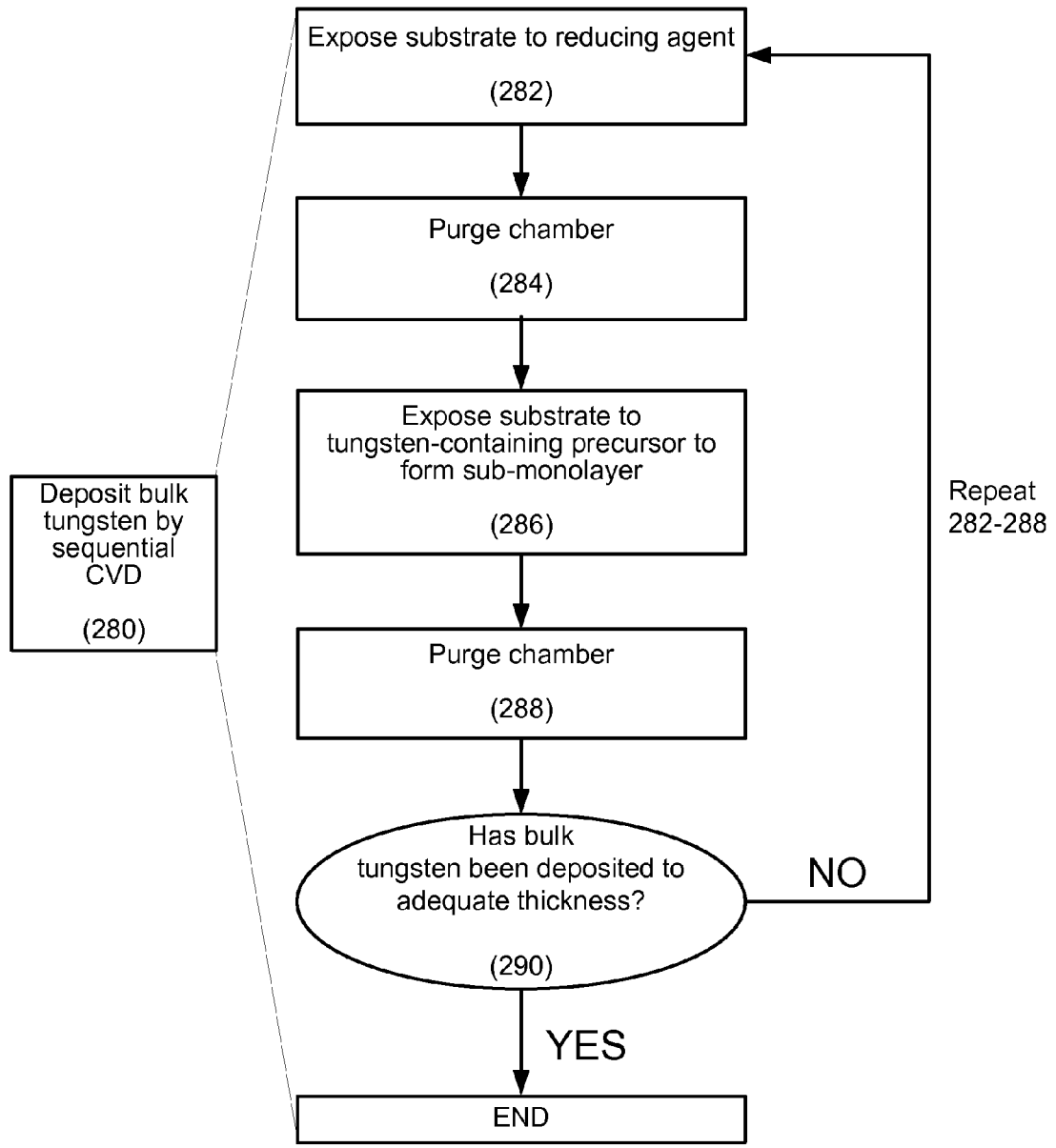
Figure 2C:
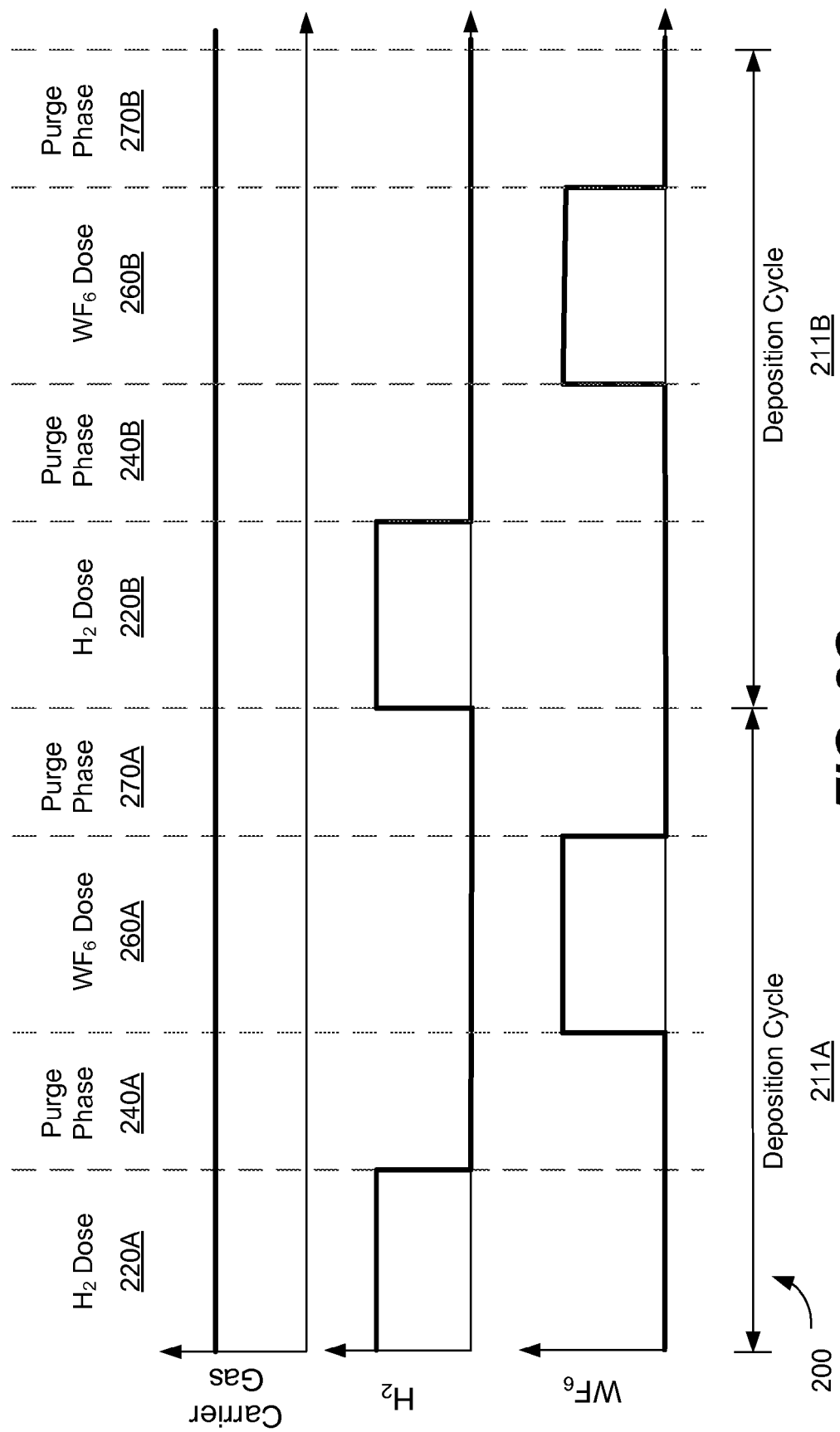
FIG. 2C is a timing sequence diagram showing example cycles in a method in accordance with disclosed embodiments.

FIG. 2B provides a process flow diagram for operations that may be performed during operation 280. Note that operations of FIG. 2B may be performed without performing operations of FIG. 2A. FIG. 2C provides a timing sequence diagram depicting examples cycles of sequential CVD in a process 200. FIGS. 3A-3J are schematic illustrations of an example mechanism for cycles of sequential CVD.

In FIG. 2B, in operation 282, the substrate is exposed to a reducing agent, such as $H_2$. This operation may be referred to as a "pulse" or a "dose," which may be used interchangeably herein. In embodiments described herein, $H_2$ is provided as an example reducing agent, but it will be understood that other reducing agents, including silanes, boranes, germanes, phosphines, hydrogen-containing gases, and combinations thereof, may be used. Unlike non-sequential CVD, $H_2$ is pulsed without flowing another reactant. In some embodiments, a carrier gas may be flowed. The carrier gas may be any of those described above with respect to operation 206 in FIG. 2A. Operation 282 may be performed for any suitable duration. In some examples, Example durations include between about 0.25 seconds and about 30 seconds, about 0.25 seconds to about 5 seconds, or about 0.5 seconds to about 3 seconds.

FIG. 2C shows $H_2$ dose 220A in deposition cycle 211A which may correspond with operation 282 of FIG. 2B. During a $H_2$ dose 220A, a carrier gas is flowed, the reducing agent is pulsed, and $WF_6$ flow is turned off.

Figure 3A:
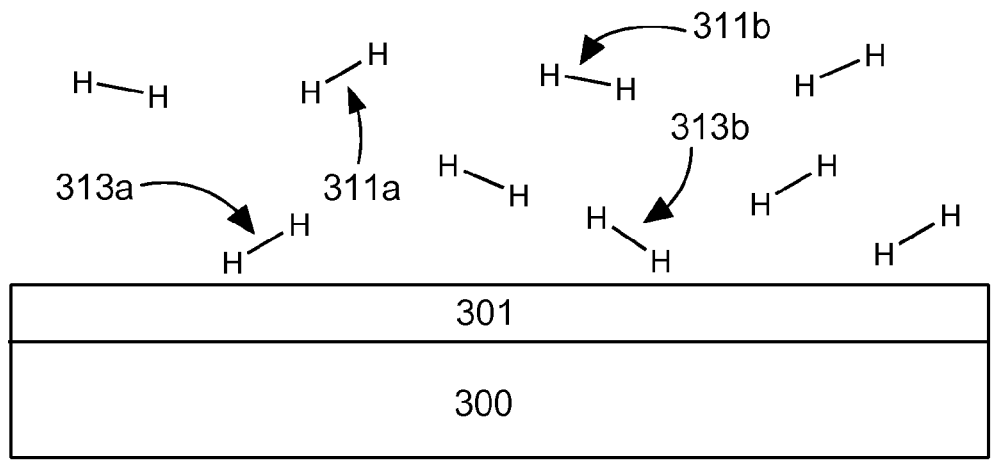
FIGS. 3A-3J are schematic diagrams of an example of a mechanism for depositing films in accordance with disclosed embodiments.

FIG. 3A depicts an example mechanism where $H_2$ is introduced to the substrate 300, which has a tungsten nucleation layer 301 deposited thereon. Hydrogen is introduced in gas phase (311a and 311b) and some $H_2$ (313a and 313b) is on the surface of the tungsten nucleation layer 301, but may not necessarily adsorb onto the surface. For example, $H_2$ may not necessarily chemisorb onto the nucleation layer 301, but in some embodiments, may physisorb onto the surface of the nucleation layer 301.

Figure 3B:
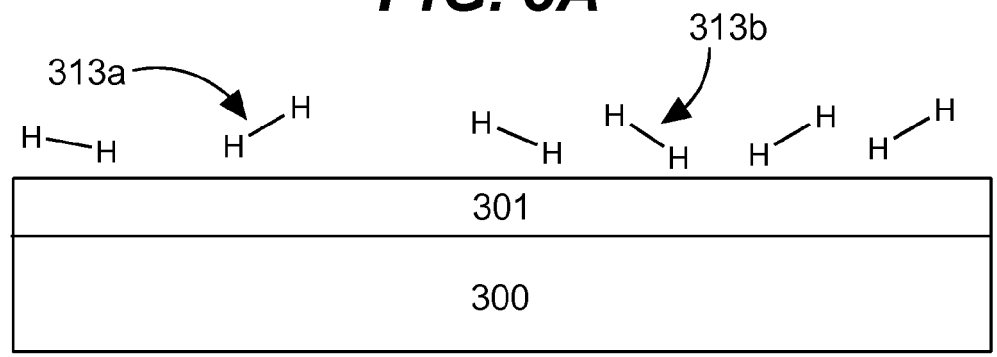

Returning to FIG. 2B, in operation 284, the chamber is purged. This purge operation may remove excess $H_2$ that remained in gas phase. A purge is conducted by flowing an inert gas at a fixed pressure thereby reducing the pressure of the chamber and re-pressurizing the chamber before initiating another gas exposure. The chamber may be purged for any suitable duration, for example, for a duration between about 0.1 seconds and about 3 seconds. Operation 284 of FIG. 2B may correspond to purge phase 240A of FIG. 2C. As shown in FIG. 2C, during purge phase 240A, the carrier gas is flowed but $H_2$ flow and $WF_6$ flow are turned off. FIG. 3B shows an example illustration whereby $H_2$ previously in gas phase (311a and 311b in FIG. 3A) are purged from the chamber, and $H_2$ previously on the surface (313a and 313b) remain on the surface of the tungsten nucleation layer 301.

Returning to FIG. 2B, in operation 286, the substrate is exposed to a tungsten-containing precursor (e.g., $WF_6$) to form a sub-monolayer of film on the substrate. In various embodiments, $WF_6$ is flowed to the chamber during this operation for a duration between about 0.1 seconds and about 3 seconds, or about 0.5 seconds. In some embodiments, $WF_6$ may be diverted to fill the gas line and line change before dosing. In some embodiments, $WF_6$ is flowed to the chamber but does not fully react with all $H_2$ molecules on the surface of the substrate. Operation 286 may correspond to $WF_6$ dose 260A in FIG. 2C. As shown in FIG. 2C, during the $WF_6$ dose 260A, the carrier gas is flowed, the $H_2$ flow is turned off, and the $WF_6$ flow is turned on.

Figure 3C:
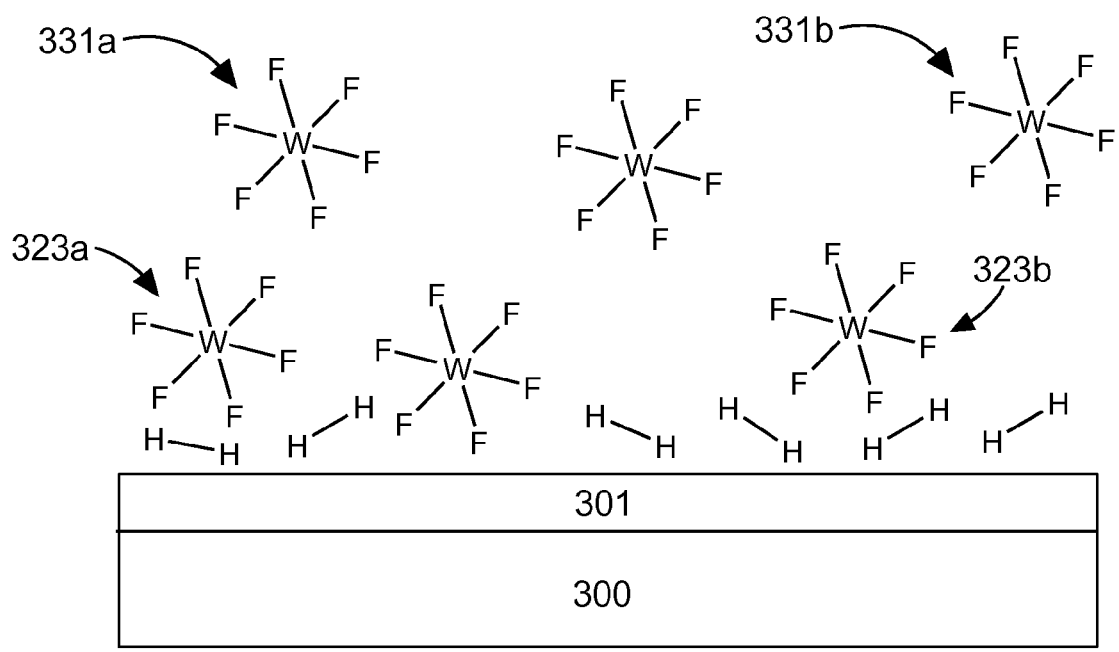

FIG. 3C shows an example schematic for operation 286 of FIG. 2B. In FIG. 3C, the substrate is exposed to $WF_6$, some of which is in gas phase (331a and 331b) and some of which is at or near the surface of the substrate (323a and 323b).

Figure 3D:
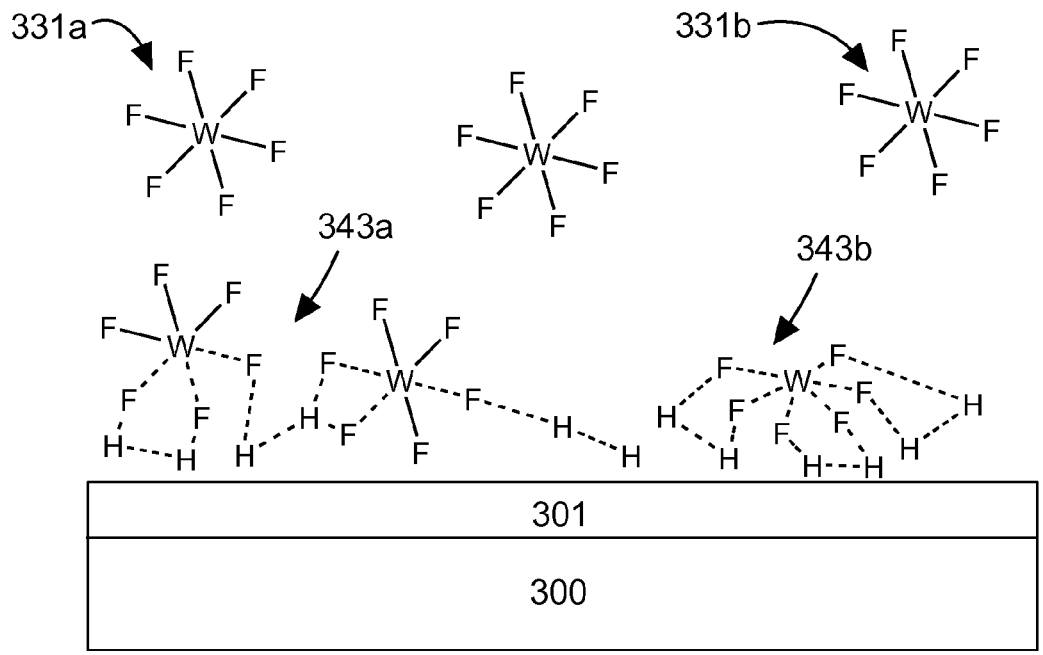
Figure 3E:
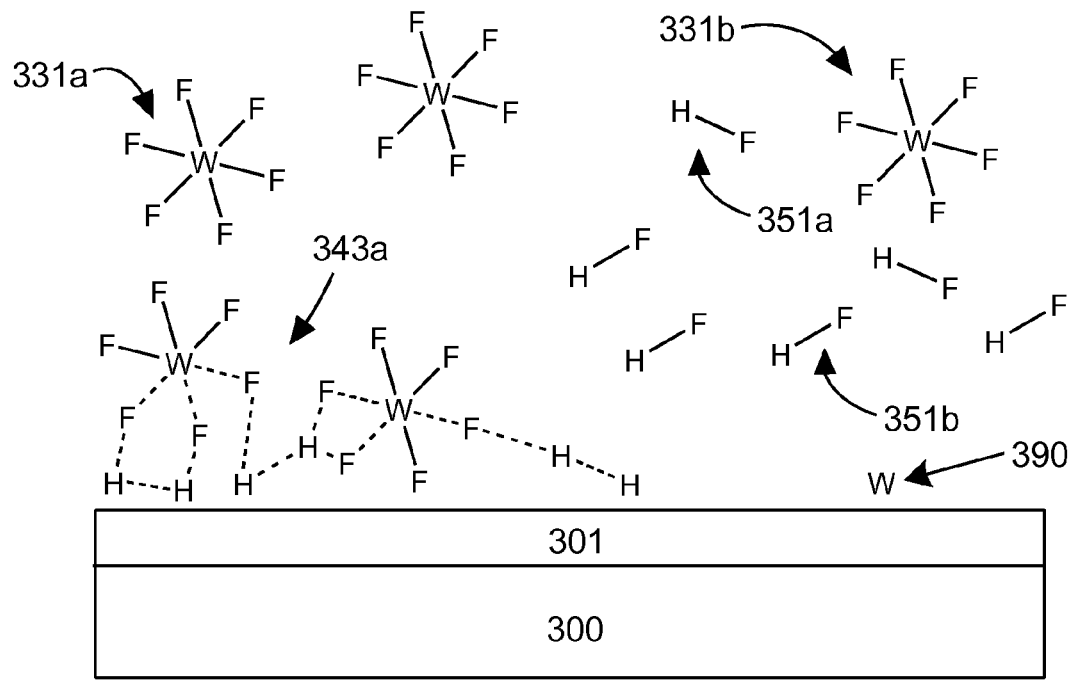

During operation 286 of FIG. 2B, some $WF_6$ may react with $H_2$ that remained on the surface from the prior dose. As shown in FIG. 3D, $WF_6$ may react with $H_2$ to temporarily form intermediate 343b, whereby in FIG. 3E, intermediate 343b fully reacts to leave tungsten 390 on the surface of the substrate 300 on the nucleation layer 301, and HF in gas phase (351a and 351b, for example).

During operation 286 of FIG. 2B, some $WF_6$ may not fully react with $H_2$ that remained on the surface from the prior dose. As shown in FIG. 3D, $WF_6$ may partially react with $H_2$ to form intermediate 343a, whereby in FIG. 3E, intermediate 343a remains partially reacted on the surface of the substrate 300 on the nucleation layer 301. The reaction mechanism involving $WF_6$ and $H_2$ may be slower than a reaction between a borane or a silane or a germane with $WF_6$ for deposition of a tungsten nucleation layer due to activation energy barriers and steric effects. For example, without being bound by a particular theory, the stoichiometry of $WF_6$ may use at least three $H_2$ molecules to react with one molecule of $WF_6$. It is possible that $WF_6$ partially reacts with molecules of $H_2$ but rather than forming tungsten, an intermediate is formed. For example, this may occur if there is not enough $H_2$ in its vicinity to react with $WF_6$ based on stoichiometric principles (e.g., three $H_2$ molecules are used to react with one molecule of $WF_6$) thereby leaving an intermediate 343a on the surface of the substrate.

During operation 286 of FIG. 2B, some $WF_6$ may not react with $H_2$ at all and may instead be physisorbed onto the surface of the substrate where no $H_2$ physisorbed or remained on the substrate surface. In some embodiments, $WF_6$ may remain on the substrate surface but may not be physisorbed or chemisorbed to the surface.

Operation 286 of FIG. 2B may thereby form a sub-monolayer of tungsten in many embodiments. For example, a sub-monolayer having a thickness of about 0.3 Å may be deposited after performing operations 282-286.

In operation 288 of FIG. 2B, the chamber is purged to remove reacted byproducts and $WF_6$ in gas phase from the chamber. In some embodiments, a purge duration that is too short in operation 288 may increase non-sequential CVD reaction characteristics such that a higher stress film will be deposited. In some embodiments, the purge duration is between about 0.1 seconds and about 2 seconds and may prevent removing all of the $WF_6$ from the substrate surface due to the low adsorption rate of $WF_6$ to a surface of tungsten. In some embodiments, purge duration is between about 0.1 seconds and about 15 seconds, such as about 7 seconds. For example, for fabrication of a 3D NAND structure, the chamber may be purged for about 7 seconds during operation 288. The purge duration depends on the substrate and stress.

Figure 3F:
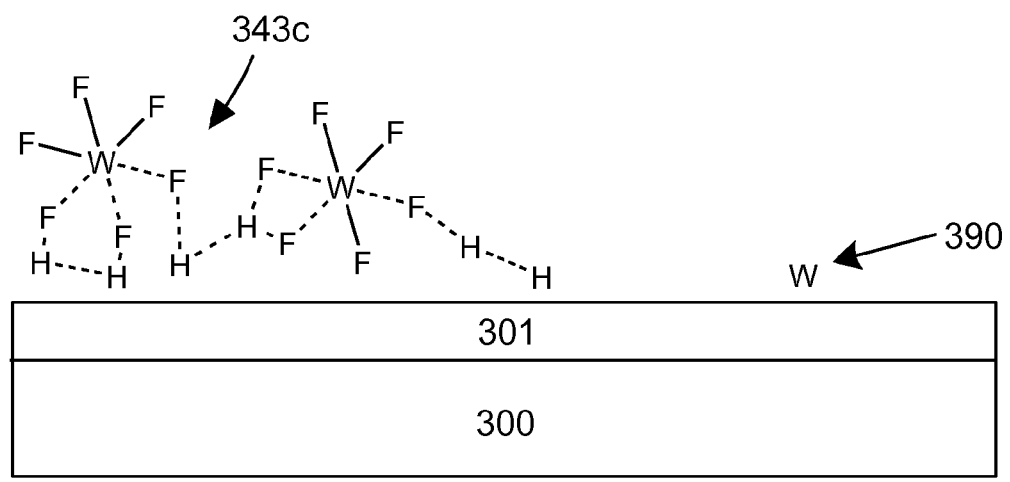

Operation 288 of FIG. 2B may correspond to purge phase 270A of FIG. 2C. As shown in FIG. 2C, purge phase 270A concludes deposition cycle 211A. FIG. 3F provides an example schematic of the substrate when the chamber is purged. Note that compound 343c may be an intermediate formed but not completely reacted, while some tungsten 390 may be formed on the substrate. Each cycle thereby forms a sub-monolayer of tungsten on the substrate.

In some embodiments, operations 286 and 282 may be reversed such that operation 286 is performed before 282. In some embodiments, operation 282 may be performed before operation 286.

In operation 290 of FIG. 2B, it is determined whether bulk tungsten has been deposited to an adequate thickness. If not, operations 282-288 are repeated until a desired thickness is deposited. In some embodiments, operations 282-288 are repeated until a feature is filled. In FIG. 2C, it is determined that bulk tungsten has not been deposited to an adequate thickness, so operations 282-288 of FIG. 2B are repeated in deposition cycle 211B, such that an $H_2$ dose 220B is performed, followed by a purge phase 240B. A $WF_6$ dose 260B is performed, followed by another purge phase 270B.

Figure 3G:
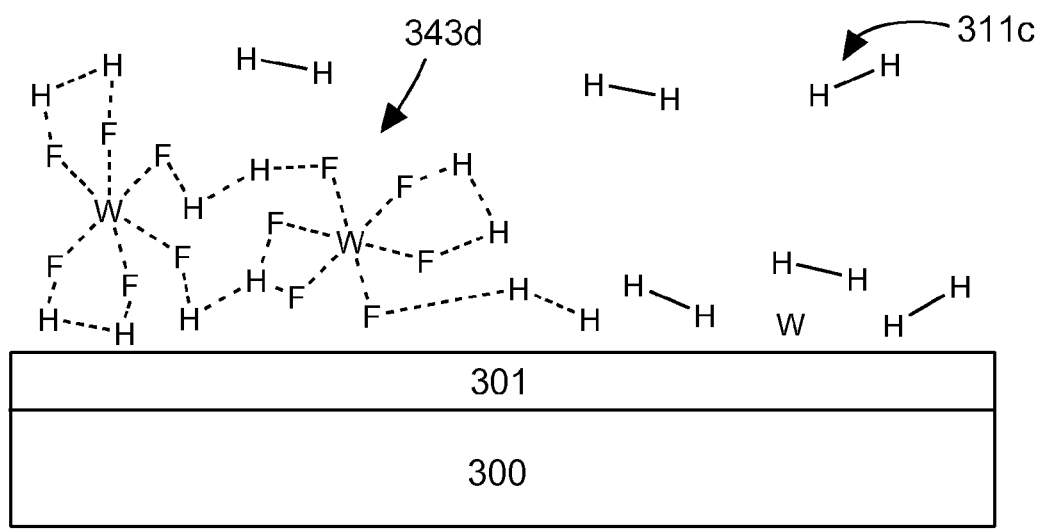
Figure 3H:
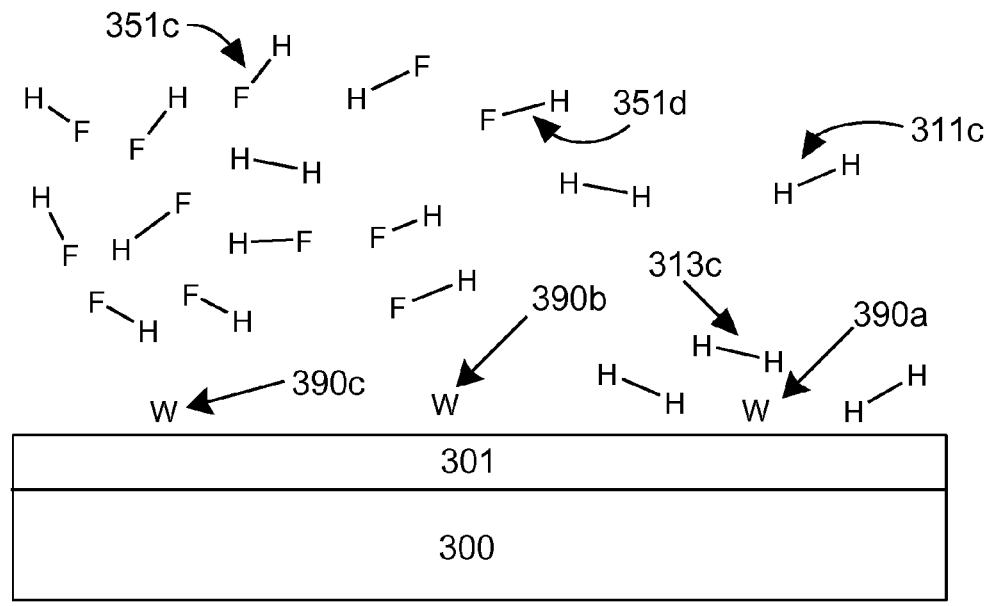
Figure 3I:
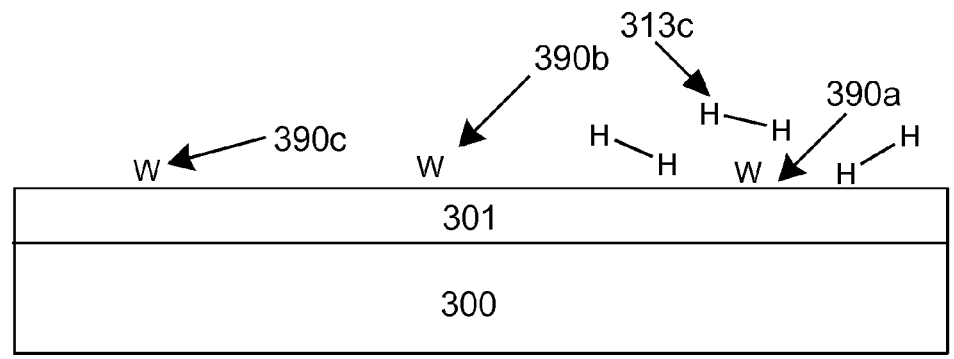
Figure 3J:
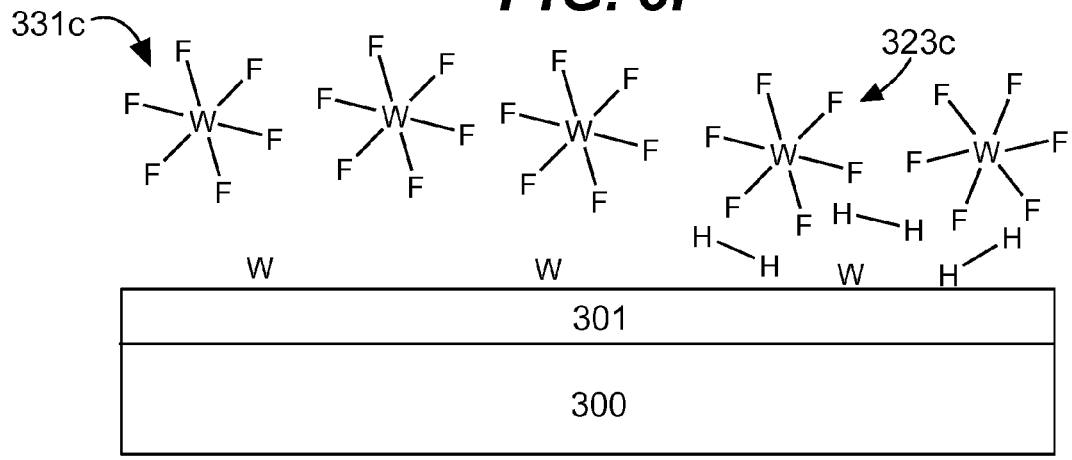

As an example, FIG. 3G shows operation 282 in the repeated cycle, whereby $H_2$ 311c in gas phase is introduced to the substrate with the deposited tungsten 390 and the partially reacted intermediate 343d thereon. Note that the $H_2$ introduced may now fully react with the intermediate 343d on the substrate such that, as shown in FIG. 3H, the reacted compound 343d leaves behind deposited tungsten 390b and 390c, and byproducts HF 351c and 351d are formed in gas phase. Some $H_2$ 311c may remain in gas phase, while some $H_2$ 313c may remain on the tungsten layer 390a. In FIG. 3I, the chamber is purged (thereby corresponding with operation 284 of FIG. 2B, or operation 240B of FIG. 2C), leaving behind deposited tungsten 390a, 390b, and 390c, and some $H_2$ 313c. In FIG. 3J, $WF_6$ is again introduced in a dose such that molecules 331c and 323c may then adsorb and/or react with $H_2$ and the substrate. FIG. 3J may correspond to operation 286 of FIG. 2B or 260B of FIG. 2C. After the $WF_6$ dose, the chamber may again be purged and cycles may be repeated again until the desired thickness of tungsten is deposited.

Tungsten films deposited using disclosed embodiments have low fluorine concentrations, such as about two orders of magnitude less fluorine concentration than tungsten deposited by non-sequential CVD. Deposition conditions, such as temperature, pulse times, and other parameters, may vary depending on hardware or process modifications. Overall tensile stress of films may be less than about 1 GPa.

Figure 3K:
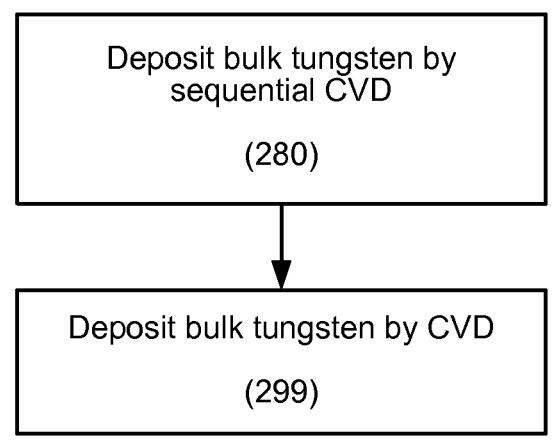
FIG. 3K is a process flow diagram depicting operations for a method in accordance with disclosed embodiments.

FIG. 3K provides a process flow diagram for a method performed in accordance with disclosed embodiments. In operation 280, bulk tungsten is deposited by sequential CVD. The process conditions and chemistries may be any of those described above with respect to FIGS. 2B and 3A-3J. In operation 299, bulk tungsten is deposited by non-sequential CVD. During non-sequential CVD, a substrate is exposed to a tungsten-containing precursor and a reducing agent simultaneously to deposit bulk. Example tungsten-containing precursors include fluorine-containing precursors (e.g., $WF_6$), chlorine-containing precursors (e.g., $WCl_x$), and tungsten hexacarbonyl ($W(CO)_6$). Example reducing agents include hydrogen. In some embodiments, non-sequential CVD is deposited by exposing the substrate to $WF_6$ and $H_2$. Operations 280 and 299 may be performed sequentially, or any of operation 280 may be performed one or more times before or after performing operation 299. In some embodiments, operations 280 and 299 are performed in pulses, such that operation 299 is performed every 2 or more cycles of performing operation 280. Bulk tungsten may thus be deposited using a combination of sequential CVD and non-sequential CVD.

Disclosed embodiments may have various applications in tungsten deposition processes. For example, in some embodiments, a feature may be filled by depositing a tungsten nucleation layer by ALD cycles of alternating pulses of a reducing agent (e.g., a borane, a silane, or a germane) and $WF_6$, followed by bulk tungsten deposition by sequential CVD as described above with respect to FIG. 2B.

In another example, in some embodiments, a tungsten nucleation layer may be deposited using ALD cycles of a reducing agent and $WF_6$, followed by bulk tungsten deposition using a combination of CVD of fluorine-free tungsten using a reducing agent and a fluorine-free tungsten-containing precursor (e.g., a metal-organic tungsten precursor), and sequential CVD as described above with respect to FIG. 2B. Fluorine-free tungsten precursors may also include tungsten carbonyl ($W(CO)_6$), and tungsten chlorides ($WCl_x$) such as tungsten pentachloride ($WCl_5$) and tungsten hexachloride ($WCl_6$).

In another example, a tungsten nucleation layer may be deposited on a feature by ALD cycles of alternating pulses of a reducing agent and $WF_6$, and tungsten bulk may be deposited by alternating between sequential CVD as described above with respect to FIG. 2B and non-sequential CVD. For example, bulk tungsten may be deposited using a number of cycles of sequential CVD between pre-determined durations of non-sequential CVD. In a specific example, bulk tungsten may be deposited using about 5 cycles of sequential CVD, followed by 5 seconds of non-sequential CVD, followed by 5 cycles of sequential CVD, and another 5 seconds of non-sequential CVD.

In another example, a feature may be filled by first depositing a tungsten nucleation layer by ALD cycles of alternating pulses of a reducing agent and $WF_6$, then partially filling the feature using sequential CVD, and filling the rest of the feature by non-sequential CVD.

In another example, a feature may be filled by depositing a tungsten nucleation layer by ALD cycles of alternating pulses of a reducing agent and $WF_6$, followed by partial deposition of bulk tungsten by sequential CVD, and complete bulk fill by CVD of fluorine-free tungsten (such as using a metal-organic tungsten precursor). For example, a number of cycles of sequential CVD may be performed to partially fill a feature with bulk tungsten, followed by CVD using simultaneous exposure to MDNOW and $H_2$ to fill the rest of the feature. Note in some embodiments, a feature may be filled without depositing a nucleation layer, but a nucleation layer may help reduce growth delay of bulk tungsten.

It will be understood that various combinations of the applications described herein may be used to deposit tungsten and methods are not limited to the examples provided herein. For example, chlorine-containing tungsten precursors ($WCl_x$) such as tungsten pentachloride ($WCl_5$) and tungsten hexachloride ($WCl_6$) may be used instead of or in combination with $WF_6$ in embodiments described herein.

Apparatus

Any suitable chamber may be used to implement the disclosed embodiments. Example deposition apparatuses include various systems, e.g., ALTUS® and ALTUS® Max, available from Lam Research Corp., of Fremont, Calif., or any of a variety of other commercially available processing systems. In some embodiments, sequential chemical vapor deposition (CVD) may be performed at a first station that is one of two, five, or even more deposition stations positioned within a single deposition chamber. Thus, for example, hydrogen ($H_2$) and tungsten hexafluoride ($WF_6$) may be alternately introduced to the surface of the semiconductor substrate, at the first station, using an individual gas supply system that creates a localized atmosphere at the substrate surface. Another station may be used for fluorine-free tungsten deposition, or non-sequential CVD. Another station may be used to deposit the tungsten nucleation layer at low pressure. Two or more stations may be used to deposit tungsten in a parallel processing. Alternatively a wafer may be indexed to have the sequential CVD operations performed over two or more stations sequentially.

Figure 4:
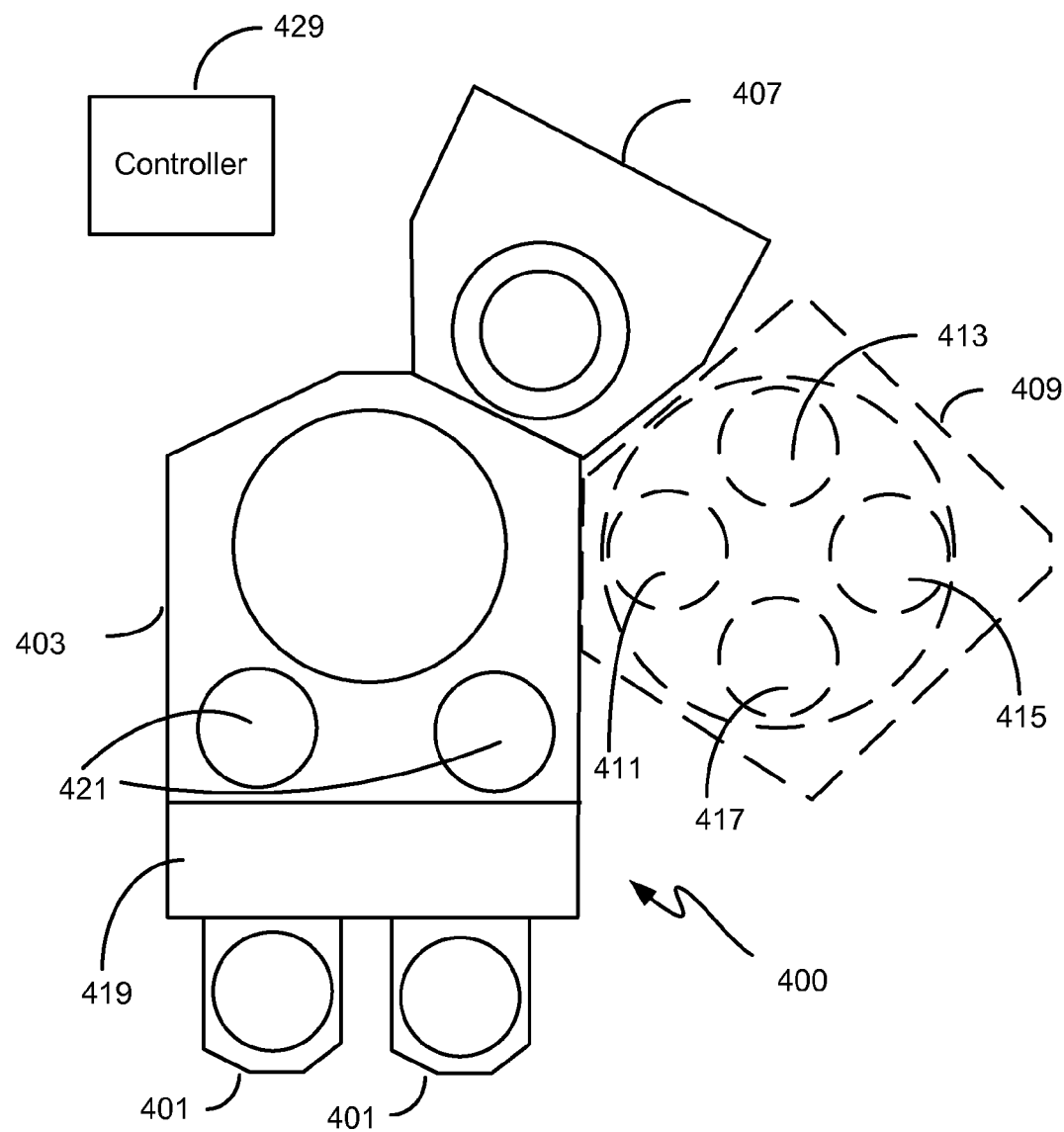
FIG. 4 is a schematic diagram of an example process tool for performing disclosed embodiments.
Figure 5:
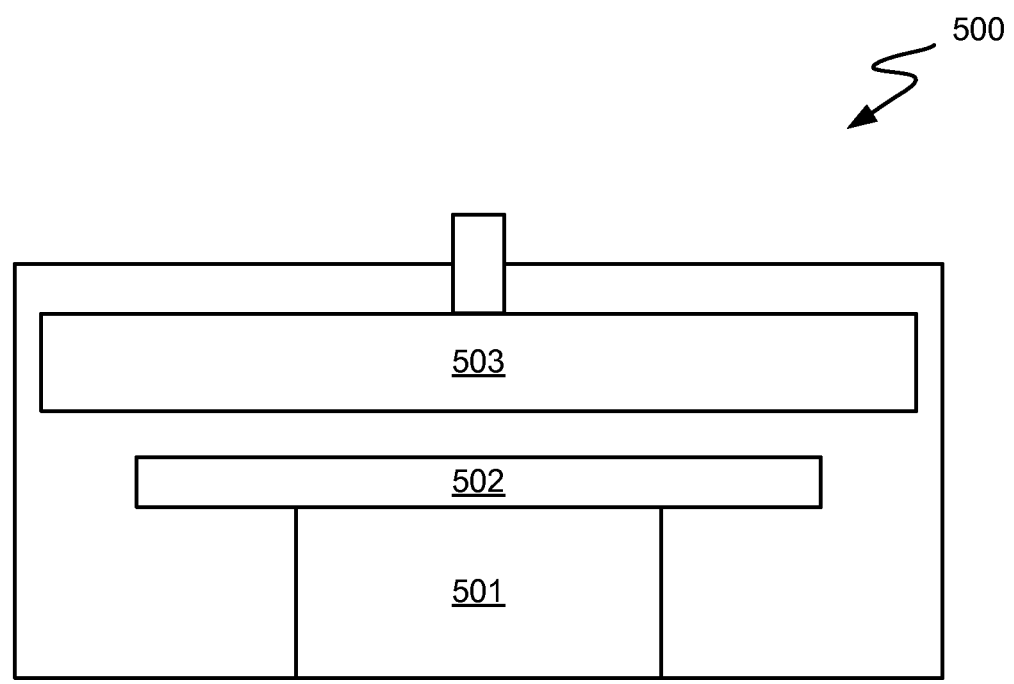
FIG. 5 is a schematic diagram of an example station for performing disclosed embodiments.

FIG. 4 is a block diagram of a processing system suitable for conducting tungsten thin film deposition processes in accordance with embodiments. The system 400 includes a transfer module 403. The transfer module 403 provides a clean, pressurized environment to minimize risk of contamination of substrates being processed as they are moved between various reactor modules. Mounted on the transfer module 403 is a multi-station reactor 409 capable of performing atomic layer deposition (ALD), and sequential CVD according to embodiments. Multi-station reactor 409 may also be used to perform fluorine-free tungsten deposition and/or non-sequential CVD in some embodiments. Reactor 409 may include multiple stations 411, 413, 415, and 417 that may sequentially perform operations in accordance with disclosed embodiments. For example, reactor 409 could be configured such that station 411 performs nucleation layer deposition by ALD, station 413 performs sequential CVD, station 415 performs fluorine-free tungsten deposition, and station 417 performs non-sequential CVD. Stations may include a heated pedestal or substrate support, one or more gas inlets or showerhead or dispersion plate. An example of a deposition station 500 is depicted in FIG. 5, including substrate support 502 and showerhead 503. A heater may be provided in pedestal portion 501.

Also mounted on the transfer module 403 may be one or more single or multi-station modules 407 capable of performing plasma or chemical (non-plasma) pre-cleans. The module may also be used for various treatments to, for example, prepare a substrate for a deposition process. The system 400 also includes one or more wafer source modules 401, where wafers are stored before and after processing. An atmospheric robot (not shown) in the atmospheric transfer chamber 419 may first remove wafers from the source modules 401 to loadlocks 421. A wafer transfer device (generally a robot arm unit) in the transfer module 403 moves the wafers from loadlocks 421 to and among the modules mounted on the transfer module 403.

In various embodiments, a system controller 429 is employed to control process conditions during deposition. The controller 429 will typically include one or more memory devices and one or more processors. A processor may include a CPU or computer, analog and/or digital input/output connections, stepper motor controller boards, etc.

The controller 429 may control all of the activities of the deposition apparatus. The system controller 429 executes system control software, including sets of instructions for controlling the timing, mixture of gases, chamber pressure, chamber temperature, wafer temperature, radio frequency (RF) power levels, wafer chuck or pedestal position, and other parameters of a particular process. Other computer programs stored on memory devices associated with the controller 429 may be employed in some embodiments.

Typically there will be a user interface associated with the controller 429. The user interface may include a display screen, graphical software displays of the apparatus and/or process conditions, and user input devices such as pointing devices, keyboards, touch screens, microphones, etc.

System control logic may be configured in any suitable way. In general, the logic can be designed or configured in hardware and/or software. The instructions for controlling the drive circuitry may be hard coded or provided as software. The instructions may be provided by "programming." Such programming is understood to include logic of any form, including hard coded logic in digital signal processors, application-specific integrated circuits, and other devices which have specific algorithms implemented as hardware. Programming is also understood to include software or firmware instructions that may be executed on a general purpose processor. System control software may be coded in any suitable computer readable programming language.

The computer program code for controlling the germanium-containing reducing agent pulses, hydrogen flow, and tungsten-containing precursor pulses, and other processes in a process sequence can be written in any conventional computer readable programming language: for example, assembly language, C, C++, Pascal, Fortran, or others. Compiled object code or script is executed by the processor to perform the tasks identified in the program. Also as indicated, the program code may be hard coded.

The controller parameters relate to process conditions, such as, for example, process gas composition and flow rates, temperature, pressure, cooling gas pressure, substrate temperature, and chamber wall temperature. These parameters are provided to the user in the form of a recipe, and may be entered utilizing the user interface.

Signals for monitoring the process may be provided by analog and/or digital input connections of the system controller 429. The signals for controlling the process are output on the analog and digital output connections of the deposition apparatus 400.

The system software may be designed or configured in many different ways. For example, various chamber component subroutines or control objects may be written to control operation of the chamber components necessary to carry out the deposition processes in accordance with the disclosed embodiments. Examples of programs or sections of programs for this purpose include substrate positioning code, process gas control code, pressure control code, and heater control code.

In some implementations, a controller 429 is part of a system, which may be part of the above-described examples. Such systems can include semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller 429, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings in some systems, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller 429, in some implementations, may be a part of or coupled to a computer that is integrated with, coupled to the system, otherwise networked to the system, or a combination thereof. For example, the controller 429 may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by including one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a CVD chamber or module, an ALD chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

The controller 429 may include various programs. A substrate positioning program may include program code for controlling chamber components that are used to load the substrate onto a pedestal or chuck and to control the spacing between the substrate and other parts of the chamber such as a gas inlet and/or target. A process gas control program may include code for controlling gas composition, flow rates, pulse times, and optionally for flowing gas into the chamber prior to deposition in order to stabilize the pressure in the chamber. A pressure control program may include code for controlling the pressure in the chamber by regulating, e.g., a throttle valve in the exhaust system of the chamber. A heater control program may include code for controlling the current to a heating unit that is used to heat the substrate. Alternatively, the heater control program may control delivery of a heat transfer gas such as helium to the wafer chuck.

Examples of chamber sensors that may be monitored during deposition include mass flow controllers, pressure sensors such as manometers, and thermocouples located in the pedestal or chuck. Appropriately programmed feedback and control algorithms may be used with data from these sensors to maintain desired process conditions.

The foregoing describes implementation of disclosed embodiments in a single or multi-chamber semiconductor processing tool. The apparatus and process described herein may be used in conjunction with lithographic patterning tools or processes, for example, for the fabrication or manufacture of semiconductor devices, displays, LEDs, photovoltaic panels, and the like. Typically, though not necessarily, such tools/processes will be used or conducted together in a common fabrication facility. Lithographic patterning of a film typically includes some or all of the following steps, each step provided with a number of possible tools: (1) application of photoresist on a workpiece, i.e., substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper.

EXPERIMENTAL

Experiment 1

Figure 6:
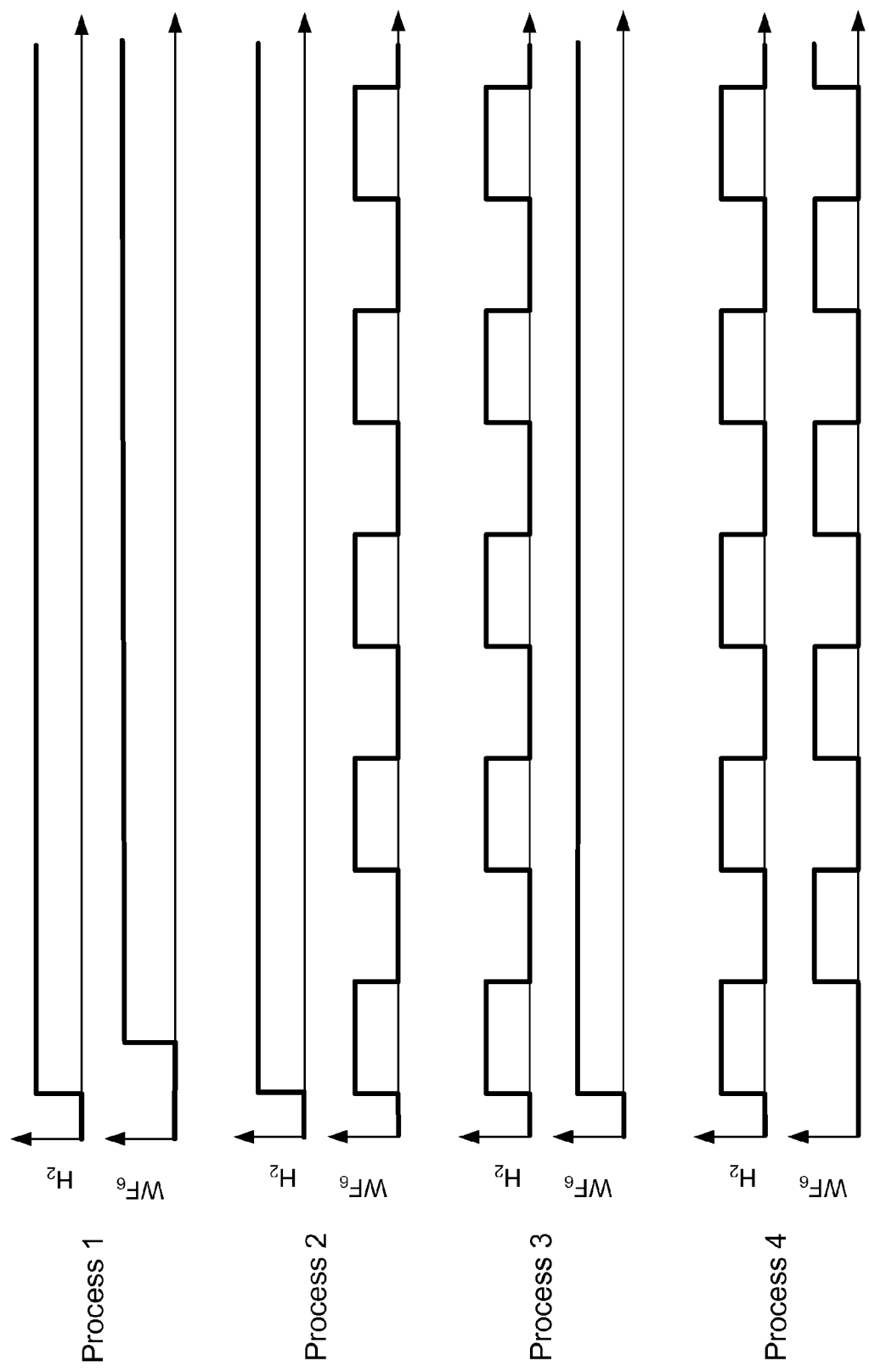
FIG. 6 depicts various timing sequence diagrams.

An experiment was conducted for four processes for depositing bulk tungsten at 395° C. at a pressure of 40 Torr. In each process, bulk tungsten was deposited on a tungsten nucleation layer deposited using atomic layer deposition (ALD) alternating cycles of diborane ($B_2H_6$) and tungsten hexafluoride ($WF_6$). FIG. 6 provides example pulsing schemes for each of these four processes. In Process 1, $H_2$ and $WF_6$ are simultaneously and continuously flowed into the chamber, such as during traditional chemical vapor deposition (CVD). In Process 2, $H_2$ is continuously flowed while $WF_6$ is pulsed (e.g., pulsed CVD). In Process 3, $WF_6$ is continuously flowed while $H_2$ is pulsed (e.g., pulsed CVD). In Process 4, $H_2$ and $WF_6$ are alternately pulsed using a method such as that described above with respect to FIG. 2B (e.g., sequential CVD). The thickness of the tungsten nucleation layer, the stress, nonuniformity, and resistivity of films deposited using each of these four processes were measured and compiled in Table 1 below.

TABLE 1

Resistivity and Stress

| Process | Nucleation Layer Thickness (Å) | Stress (Mpa) | Nonuniformity (%) | Resistivity (μohm-cm) |
|---|---|---|---|---|
| 1 | 507 | 2251 | 10.89 | 13.32 |
| 2 | 533 | 2207 | 4.31 | 12.79 |
| 3 | 517 | 2275 | 41.56 | 13.20 |
| 4 | 673 | 1634 | 21.77 | 10.81 |

As shown in Table 1, both the stress and the resistivity of the tungsten film deposited using Process 4 are significantly lower than the films deposited using any of Processes 1-3.

Experiment 2

Figure 7:
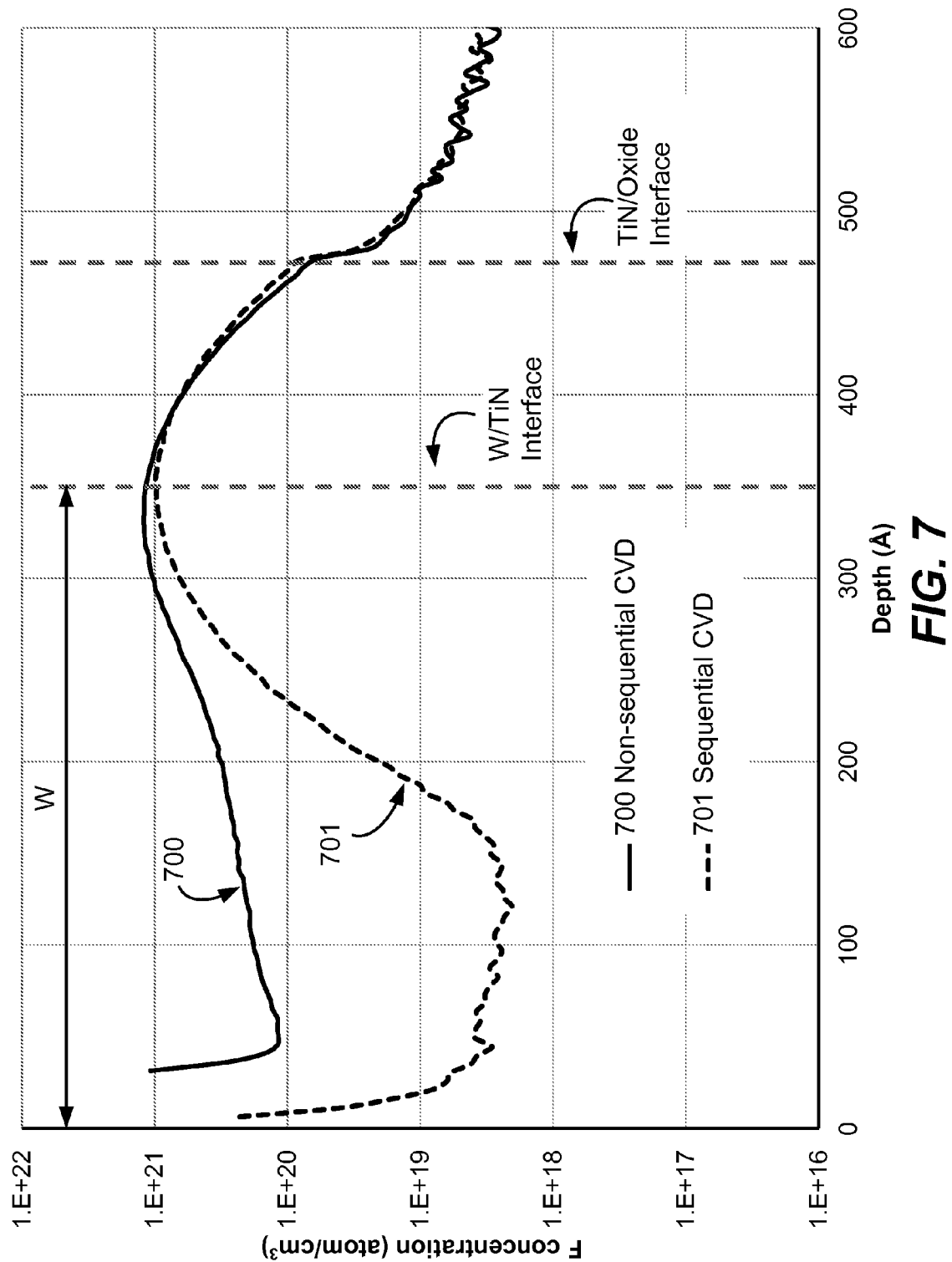
FIGS. 7-11B are plots of experimental results.

An experiment was conducted for processes for depositing bulk tungsten on two substrates, both substrates including a titanium nitride (TiN) barrier layer and a tungsten nucleation layer deposited by ALD alternating cycles of $B_2H_6$ and $WF_6$. One substrate involved deposition of bulk tungsten using non-sequential CVD, involving exposing the substrate to $WF_6$ and $H_2$ simultaneously at 300° C. Another substrate involved deposition of bulk tungsten using sequential CVD as described above with respect to FIG. 2B, involving alternating pulses of $WF_6$ and $H_2$ at a chamber pressure of 10 Torr. The fluorine concentration was measured for both substrates. The conditions for this experiment are shown in Table 2. The results are plotted in FIG. 7.

TABLE 2

Experiment 2 Conditions

| | 700 Non-sequential CVD | 701 Sequential CVD |
|---|---|---|
| Barrier Layer | TiN | TiN |
| Nucleation Layer | ALD $B_2H_6/WF_6$ | ALD $B_2H_6/WF_6$ 10 Torr |
| Bulk Tungsten Layer | CVD $WF_6$ and $H_2$ 300° C. | Sequential CVD $WF_6/H_2$ 10 Torr |

Line 700 shows the fluorine concentration for the substrate with tungsten deposited by non-sequential CVD. Line 701 shows the fluorine concentration for the substrate with tungsten deposited by sequential CVD. The W/TiN interface line at about 350 Å represents the interface between the tungsten nucleation layer and the TiN barrier layer. The TiN/Oxide interface dotted line at about 475 Å represents the interface between the TiN barrier layer and the oxide. Note that the fluorine concentration on the y-axis of the plot is by orders of magnitude, and the sequential CVD fluorine concentration 701 is substantially lower than the non-sequential CVD fluorine concentration 700—up to two orders of magnitude lower in fluorine concentration at some substrate depths.

Experiment 3

Figure 8:
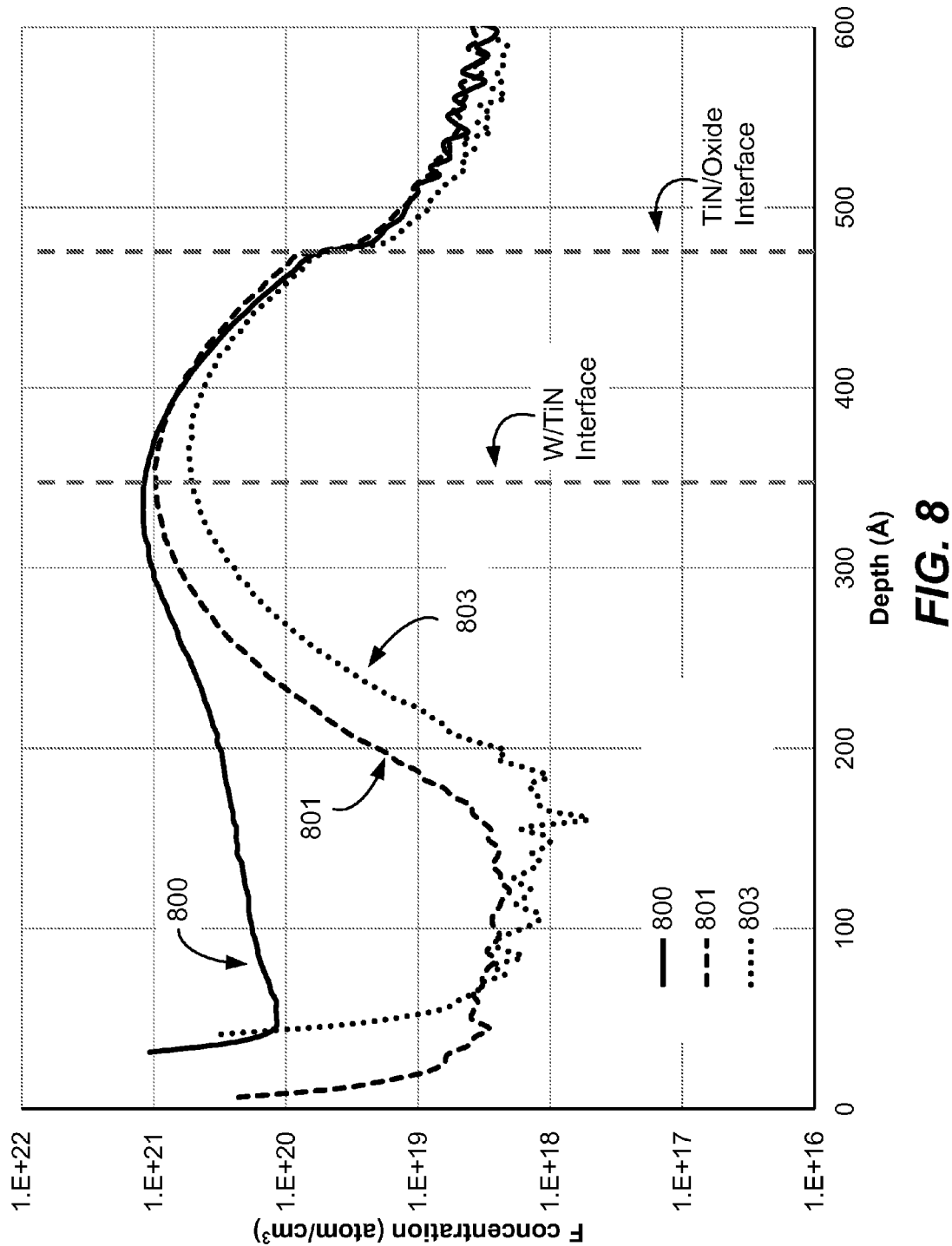

An experiment was conducted for processes for depositing bulk tungsten on substrates at different pressures. Three substrates each included a TiN barrier layer. One substrate involved deposition of a tungsten nucleation layer deposited by ALD alternating cycles of $B_2H_6$ and $WF_6$ at 10 Torr followed by CVD of bulk tungsten by exposing the substrate to $WF_6$ and $H_2$ at 300° C. Another substrate involved deposition of a tungsten nucleation layer deposited by ALD alternating cycles of $B_2H_6$ and $WF_6$ at 10 Torr followed by sequential CVD of bulk tungsten by alternating pulses of $WF_6$ and $H_2$ at 10 Torr. A third substrate involved ALD of a tungsten nucleation layer deposited by alternating cycles of $B_2H_6$ and $WF_6$ at 3 Torr followed by sequential CVD of bulk tungsten using alternating pulses of $WF_6$ and $H_2$ at 10 Torr. The fluorine concentration was measured for all three substrates. The conditions for this experiment are shown in Table 3. The results are plotted in FIG. 8.

TABLE 3

Experiment 3 Conditions

| | 800 Non-sequential CVD | 801 Sequential CVD at High P | 803 Sequential CVD at Low P |
|---|---|---|---|
| Barrier Layer | TiN | TiN | TiN |
| Nucleation Layer | ALD $B_2H_6/WF_6$ | ALD $B_2H_6/WF_6$ 10 Torr | ALD $B_2H_6/WF_6$ 3 Torr |
| Bulk Tungsten Layer | CVD $WF_6$ and $H_2$ 300° C. | Sequential CVD $WF_6/H_2$ 10 Torr | Sequential CVD $WF_6/H_2$ 10 Torr |

Line 800 represents the fluorine concentration for the first substrate where bulk tungsten was deposited by non-sequential CVD. Dashed line 801 represents the fluorine concentration for the second substrate where the nucleation layer was deposited at 10 Torr, followed by bulk tungsten deposited by sequential CVD. Dotted line 803 represents the fluorine concentration for the third substrate where the nucleation layer was deposited at 3 Torr, followed by bulk tungsten deposited by sequential CVD. The results show that low pressure nucleation layer followed by sequential CVD (803) exhibited lower fluorine concentration than the second substrate (801), even at the W/TiN interface and even in the TiN layer (between 350 Å and 475 Å). This suggests there may be reduced fluorine diffusion into the TiN layer and the oxide due to the reduced amount of fluorine concentration in the tungsten film.

Experiment 4

An experiment was conducted for processes for depositing bulk tungsten on substrates using different combinations of tungsten deposition. Three substrates were compared. One substrate included 1 kÅ of thermal oxide, 30 Å TiN, 18 Å tungsten nucleation layer deposited at 3 Torr using ALD alternating pulses of $WF_6$ and $B_2H_6$, and bulk tungsten deposited at 10 Torr using sequential CVD pulses of $WF_6$ and $H_2$. The fluorine concentration of this substrate is depicted by dashed line 912 in FIG. 9. Another substrate included 1 kÅ of thermal oxide, 30 Å TiN, 10 Å of fluorine-free tungsten, 12 Å tungsten nucleation layer deposited at 3 Torr using ALD alternating pulses of $WF_6$ and $B_2H_6$, and bulk tungsten deposited by sequential CVD at 10 Torr using pulses of $WF_6$ and $H_2$. The fluorine concentration of this second substrate is depicted by line 911 in FIG. 9. A third substrate included 5 kÅ of TEOS-deposited oxide, 30 Å of fluorine-free tungsten, 12 Å tungsten nucleation layer deposited at 3 Torr using ALD alternating pulses of $WF_6$ and $B_2H_6$, and bulk tungsten deposited by sequential CVD at 10 Torr using $WF_6$ and $H_2$. The fluorine concentration of this substrate is depicted by dotted line 913 in FIG. 9. The layers as deposited on each substrate for this experiment are summarized in Table 4.

TABLE 4

Experiment 4 Conditions

| | 911 | 912 | 913 |
|---|---|---|---|
| 1st Layer | 1 kÅ Thermal Oxide | 1 kÅ Thermal Oxide | 5 kÅ TEOS-deposited Oxide |
| 2nd Layer | 30 Å TiN | 30 Å TiN | 30 Å Fluorine-Free Tungsten |
| 3rd Layer | 10 Å Fluorine-Free Tungsten | 18 Å ALD Nucleation Layer $B_2H_6/WF_6$ 3 Torr | 12 Å ALD Nucleation Layer $B_2H_6/WF_6$ 3 Torr |
| 4th Layer | 12 Å ALD Nucleation Layer $B_2H_6/WF_6$ 3 Torr | Bulk W by Sequential CVD $WF_6/H_2$ 10 Torr | Bulk W by Sequential CVD $WF_6/H_2$ 10 Torr |
| 5th Layer | Bulk W by Sequential CVD $WF_6/H_2$ 10 Torr | | |

Figure 9:
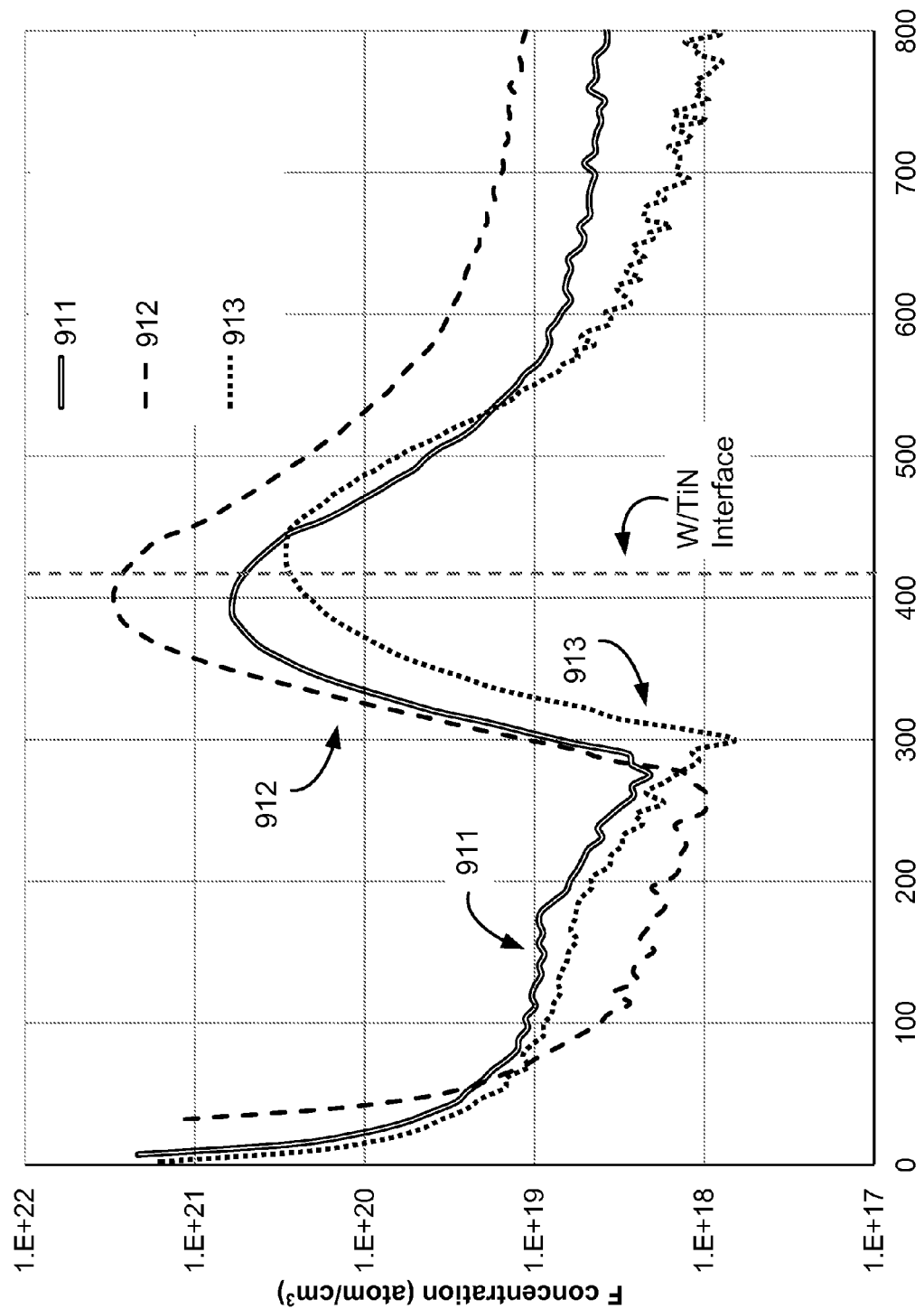

As shown in FIG. 9, fluorine concentration for films deposited using a combination of fluorine-free tungsten, low pressure nucleation layer, and sequential CVD had less fluorine diffusion (see lines 911 and lines 913 beyond the W/TiN interface where depths are greater than 425 Å). Fluorine concentration near the nucleation layer was lowest between 300 Å and 425 Å for the film with more fluorine-free tungsten deposited on the substrate, while bulk tungsten for the film deposited using sequential CVD and low pressure nucleation without a fluorine-free tungsten layer had lower fluorine concentration between about 50 Å and 300 Å (see line 912). These results suggest that a combination of depositing fluorine-free tungsten and sequential CVD of tungsten may result in tungsten films achieving extremely low fluorine concentrations and reduced fluorine diffusion.

Experiment 5

Figure 10A:
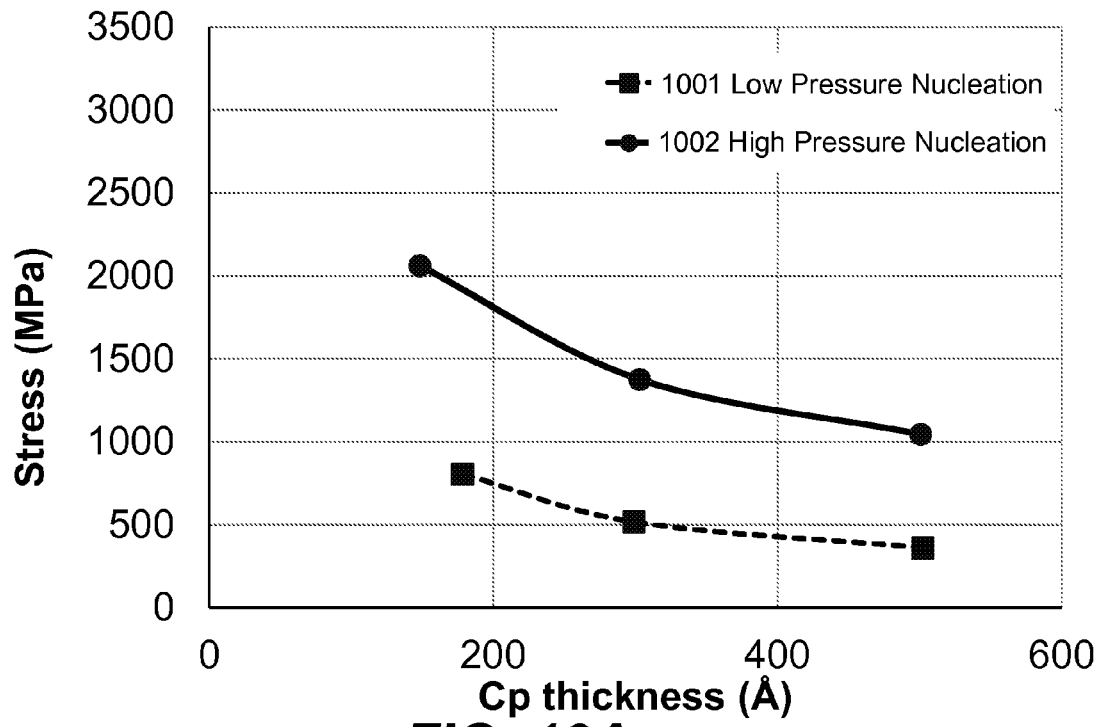
Figure 10B:
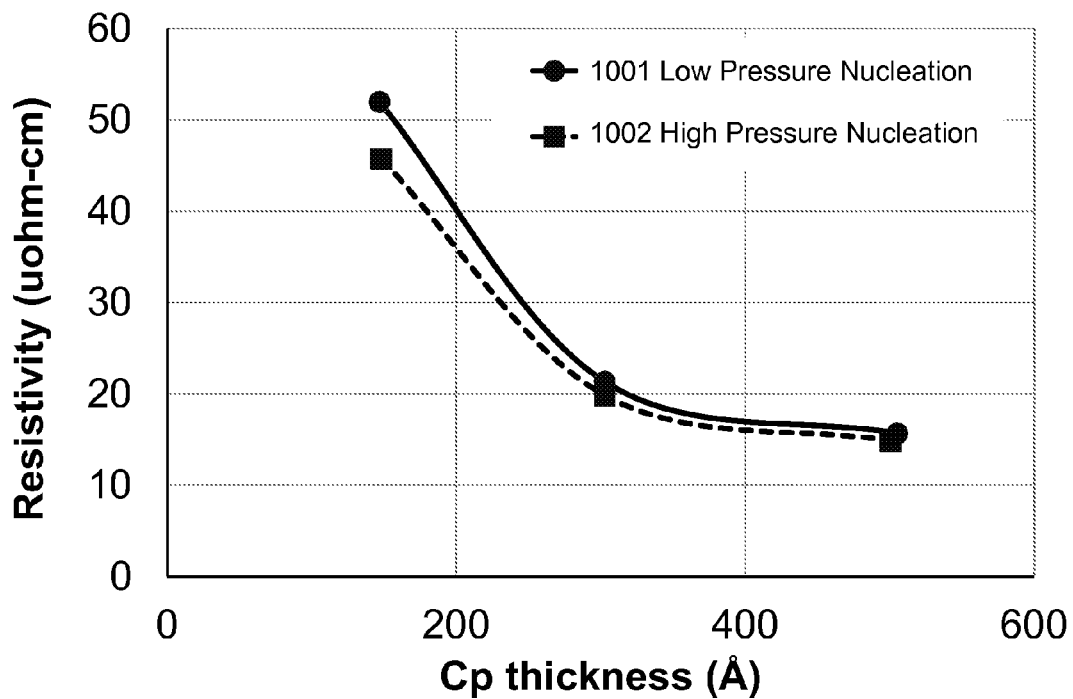

An experiment was conducted for processes films deposited by sequential CVD in combination with low pressure versus high pressure nucleation layer deposition. One substrate included a tungsten nucleation layer deposited using ALD alternating cycles of $WF_6$ and $B_2H_6$ at 10 Torr with bulk tungsten deposition by sequential CVD in accordance with FIG. 2B as described above using alternating pulses of $WF_6$ and $H_2$ at 10 Torr. The stress and resistivity of the film was measured at various thicknesses and is shown as line 1001 "low pressure nucleation" in FIGS. 10A and 10B. Another substrate included a tungsten nucleation layer deposited using ALD alternating cycles of $WF_6$ and $B_2H_6$ at 40 Torr with bulk tungsten deposition by sequential CVD in accordance with FIG. 2B as described above using alternating pulses of $WF_6$ and $H_2$ at 10 Torr. The stress and resistivity of the film was measured at various thicknesses and is shown as line 1002 "high pressure nucleation" in FIGS. 10A and 10B. Conditions for the nucleation and bulk layer depositions are shown in Table 5.

TABLE 5

Experiment 5 Conditions

| | 1001 Low Pressure Nucleation | 1002 High Pressure Nucleation |
|---|---|---|
| Nucleation Layer | ALD $B_2H_6/WF_6$ 10 Torr | ALD $B_2H_6/WF_6$ 40 Torr |
| Bulk Tungsten Layer | Sequential CVD $WF_6/H_2$ 10 Torr | Sequential CVD $WF_6/H_2$ 10 Torr |
| Temperature | 300° C. | |

As shown in the results, the substrate with the nucleation layer deposited at low pressure had substantially lower stress than the substrate with the nucleation layer deposited at high pressure, while the resistivity remained approximately the same.

Experiment 6

Figure 11A:
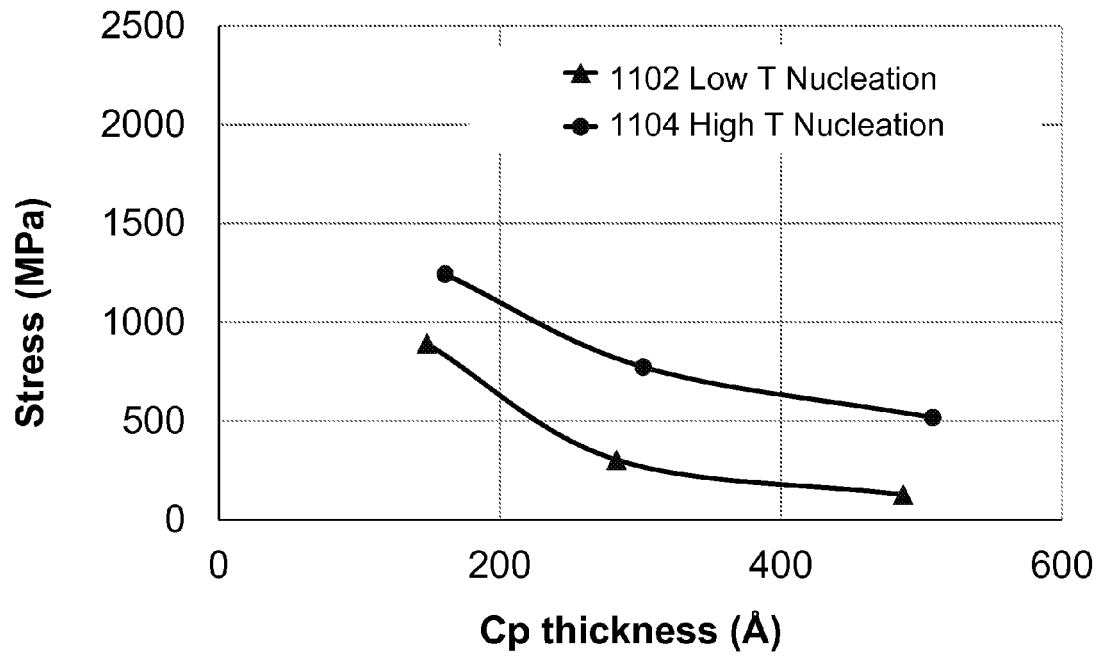
Figure 11B:
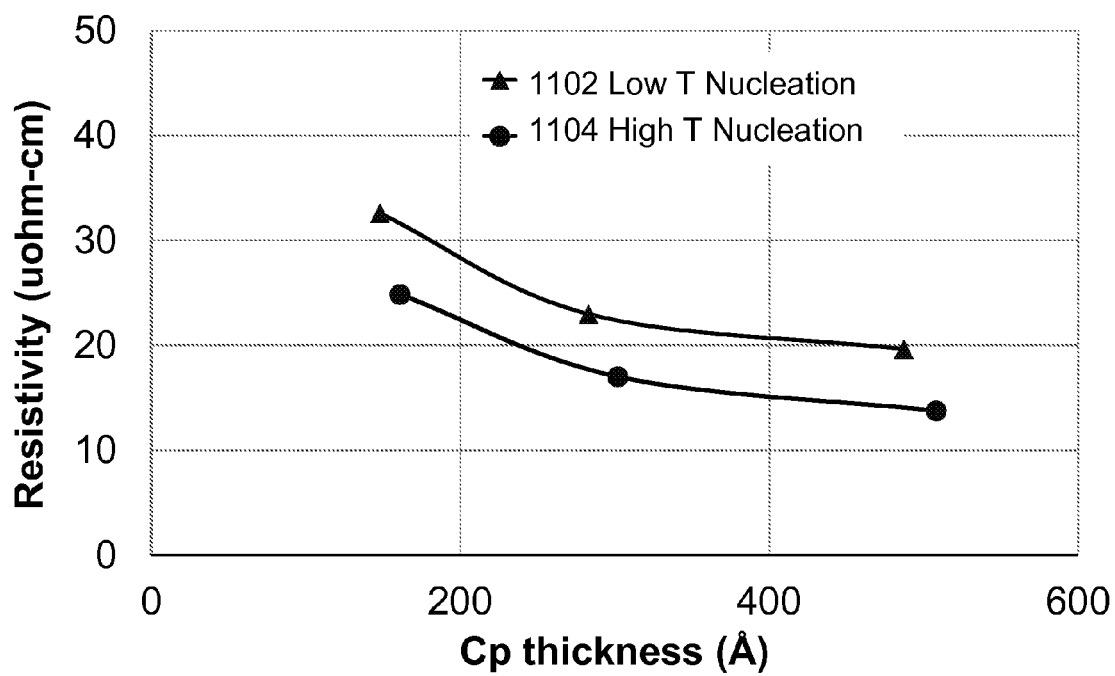

An experiment was conducted for processes films deposited by sequential CVD in combination with low temperature versus high temperature nucleation layer deposition. One substrate included a tungsten nucleation layer deposited using ALD alternating cycles of $WF_6$ and $B_2H_6$ at 10 Torr and 250° C. with bulk tungsten deposition by sequential CVD in accordance with FIG. 2B as described above using alternating pulses of $WF_6$ and $H_2$ at 10 Torr. The stress and resistivity of the film was measured at various thicknesses and is shown as line 1102 "low T nucleation" in FIGS. 11A and 11B. Another substrate included a tungsten nucleation layer deposited using ALD alternating cycles of $WF_6$ and $B_2H_6$ at 10 Torr and 300° C. with bulk tungsten deposition by sequential CVD in accordance with FIG. 2B as described above using alternating pulses of $WF_6$ and $H_2$ at 10 Torr. The stress and resistivity of the film was measured at various thicknesses and is shown as line 1104 "high T nucleation" in FIGS. 11A and 11B. Conditions for the nucleation and bulk layer depositions are shown in Table 6.

TABLE 6

Experiment 6 Conditions

| | 1102 Low Temp Nucleation | 1104 High Temp Nucleation |
|---|---|---|
| Nucleation Layer | ALD $B_2H_6/WF_6$ 10 Torr 250° C. | ALD $B_2H_6/WF_6$ 10 Torr 300° C. |
| Bulk Tungsten Layer | Sequential CVD $WF_6/H_2$ 10 Torr | Sequential CVD $WF_6/H_2$ 10 Torr |

As shown in the results, the substrate with the nucleation layer deposited at low temperature had substantially lower stress than the substrate with the nucleation layer deposited at high temperature, while the resistivity of the film deposited at higher temperature was slightly lower than the resistivity of the film deposited at lower temperature. These results suggest that lower temperature deposition of the nucleation layer in combination with sequential CVD bulk deposition can significantly reduce the stress of the film.

CONCLUSION

Although the foregoing embodiments have been described in some detail for purposes of clarity of understanding, it will be apparent that certain changes and modifications may be practiced within the scope of the appended claims. It should be noted that there are many alternative ways of implementing the processes, systems, and apparatus of the present embodiments. Accordingly, the present embodiments are to be considered as illustrative and not restrictive, and the embodiments are not to be limited to the details given herein.

What is claimed is:

1. A method of filling a feature comprising:
   (a) exposing a substrate in a chamber to alternating pulses of a reducing agent and a first tungsten-containing precursor to deposit a tungsten nucleation layer on the substrate; and
   (b) exposing the substrate to alternating pulses of hydrogen and a second tungsten-containing precursor to deposit a bulk tungsten layer over the tungsten nucleation layer,
   wherein the chamber pressure during (a) is no more than 10 Torr.

2. The method of claim 1, further comprising, (c) exposing the substrate to another reducing agent and a third tungsten-containing precursor simultaneously to deposit a second bulk tungsten layer.

3. The method of claim 2, further comprising, (d) performing (c) every 2 or more cycles of (b), wherein a cycle of (b) comprises a pulse of hydrogen and a pulse of the second tungsten-containing precursor.

4. The method of claim 1, wherein (b) is performed in cycles comprising a pulse of hydrogen and a pulse of the second tungsten-containing precursor, and each cycle forms a submonolayer having a thickness of at least about 0.3 Å.

5. The method of claim 1, wherein the first tungsten-containing precursor in (a) is different from the second tungsten-containing precursor in (b).

6. The method of claim 5, wherein the tungsten-containing precursor in (a) is fluorine-free.

7. The method of claim 1, wherein the deposited tungsten has a tensile stress less than about 1 GPa per 500 Å deposited.

8. The method of claim 1, wherein exposing the substrate to the alternating pulses of the hydrogen and the second tungsten-containing precursor to deposit the bulk tungsten layer comprises a non-self-limiting reaction between the hydrogen and the second tungsten-containing precursor.

9. A method of filling a feature comprising:
   (a) exposing the substrate to alternating pulses of hydrogen and a first tungsten-containing precursor to deposit a bulk tungsten layer over the substrate; and
   (b) exposing the substrate to a second tungsten-containing precursor and a reducing agent simultaneously to deposit a second bulk tungsten layer over the substrate.

10. The method of claim 9, wherein (a) and (b) are repeated sequentially.

11. The method of claim 9, wherein the second tungsten-containing precursor in (b) is a fluorine-free tungsten-containing precursor selected from the group consisting of metal-organic tungsten-containing precursors, tungsten chlorides, and tungsten hexacarbonyl.

12. The method of claim 9, wherein the first tungsten-containing precursor in (a) is different from the second tungsten-containing precursor in (b).

* * * * *